United States Patent
Tsukamoto et al.

(10) Patent No.: US 11,137,455 B2
(45) Date of Patent: Oct. 5, 2021

(54) MAGNETIC FIELD MEASURING ELEMENT, MAGNETIC FIELD MEASURING DEVICE, AND MAGNETIC FIELD MEASURING SYSTEM

(71) Applicants: JAPAN OIL, GAS AND METALS NATIONAL CORPORATION, Tokyo (JP); MITSUI MINERAL DEVELOPMENT ENGINEERING CO., LTD., Tokyo (JP); SUPERCONDUCTING SENSING TECHNOLOGY CORPORATION, Kanagawa (JP)

(72) Inventors: Akira Tsukamoto, Kanagawa (JP); Tsunehiro Hato, Kanagawa (JP); Keiichi Tanabe, Kanagawa (JP); Masayuki Motoori, Tokyo (JP); Hidehiro Ishikawa, Tokyo (JP)

(73) Assignees: JAPAN OIL, GAS AND METALS NATIONAL CORPORATION, Tokyo (JP); MITSUI MINERAL DEVELOPMENT ENGINEERING CO., LTD., Tokyo (JP); SUPERCONDUCTING SENSOR TECHNOLOGY CORPORATION, Kanagawa (JP)

( * ) Notice: Subject to any disclaimer, the term of this patent is extended or adjusted under 35 U.S.C. 154(b) by 0 days.

(21) Appl. No.: 16/761,500

(22) PCT Filed: Oct. 29, 2018

(86) PCT No.: PCT/JP2018/040099
§ 371 (c)(1),
(2) Date: May 5, 2020

(87) PCT Pub. No.: WO2019/093178
PCT Pub. Date: May 16, 2019

(65) Prior Publication Data
US 2021/0181271 A1    Jun. 17, 2021

(30) Foreign Application Priority Data
Nov. 8, 2017    (JP) .............................. JP2017-215720

(51) Int. Cl.
*G01R 33/00*    (2006.01)
*G01R 33/035*    (2006.01)
(Continued)

(52) U.S. Cl.
CPC ..... *G01R 33/0356* (2013.01); *G01R 33/0206* (2013.01); *H01L 39/223* (2013.01)

(58) Field of Classification Search
CPC .......................... G01R 33/00; G01R 33/0035; G01R 33/0023; G01R 33/0017; G01R 31/3191;
(Continued)

(56) References Cited

U.S. PATENT DOCUMENTS 6,300,760 B1 * 10/2001 Schubert ............ G01R 33/0358
324/248
8,179,133 B1 * 5/2012 Kornev ................. H01L 39/223
324/248
(Continued)

FOREIGN PATENT DOCUMENTS

JP    S61-159183    7/1986
JP    S64-12281    1/1989
(Continued)

*Primary Examiner* — Jermele M Hollington
*Assistant Examiner* — Taqi R Nasir
(74) *Attorney, Agent, or Firm* — The Marbury Law Group, PLLC

(57) ABSTRACT

A magnetic field measuring element includes a Superconducting QUantum Interference Device magnetic sensors, the first sensor disposed either on a second plane perpendicular
(Continued)

to a first plane including a coil surface of the third sensor and which includes the center of the third sensor, or in the vicinity of the second plane, and a second sensor disposed either on a third plane perpendicular to the first plane and the second plane, or in the vicinity of the third plane. The center of the first sensor is present either on a straight line which passes through the center of the third sensor and is perpendicular to the first plane, or in the vicinity of said straight line, and the center of the second sensor is present in a position displaced from a line joining the center of the third sensor and the center of the first sensor.

5 Claims, 18 Drawing Sheets

(51) Int. Cl.
*H01L 39/22* (2006.01)
*G01R 33/02* (2006.01)

(58) Field of Classification Search
CPC ............ G01R 33/0358; G01R 33/0356; G01B 7/004; G01C 17/38; G06F 3/017; G06F 3/0346; G06F 3/012; H01L 39/223
See application file for complete search history.

(56) References Cited

U.S. PATENT DOCUMENTS

| | | | |
|---|---|---|---|
| 2003/0111659 A1* | 6/2003 | Tzalenchuk | H01L 27/18 257/14 |
| 2009/0160444 A1 | 6/2009 | Chwala et al. | |
| 2009/0168286 A1 | 7/2009 | Berkley et al. | |
| 2012/0041297 A1 | 2/2012 | McGary | |
| 2015/0380631 A1* | 12/2015 | Taylor | H01L 39/225 257/31 |
| 2016/0041233 A1 | 2/2016 | Li et al. | |

FOREIGN PATENT DOCUMENTS

| | | |
|---|---|---|
| JP | H2-27281 | 1/1990 |
| JP | H3-131782 | 6/1991 |
| JP | H3-269378 | 11/1991 |
| JP | H7-192914 | 7/1995 |
| JP | H1-300833 | 11/1998 |

\* cited by examiner

COMPARATIVE EXAMPLE

COMPARATIVE EXAMPLE

FIG. 18

|   | X on (601) | Y on (602) | Z on (603) |
|---|---|---|---|
| X | 1 | 1/1521 | 1/1138 |
| Y | 1/780 | 1 | 1/591 |
| Z | 1/629 | 1/629 | 1 |

FIG. 19

|   | X on (611) | Y on (612) | Z on (613) |
|---|---|---|---|
| X | 1 | 1/1247 | 1/14656 |
| Y | 1/496 | 1 | 1/5517 |
| Z | 1/3440 | 1/2829 | 1 |

|   | X on | Y on | Z on |
|---|------|------|------|
| X | 1 | 1/9936 | 1/4497 |
| Y | 1/2070 | 1 | 1/7900 |
| Z | 1/14267 | 1/14625 | 1 |

MAGNETIC FIELD MEASURING ELEMENT, MAGNETIC FIELD MEASURING DEVICE, AND MAGNETIC FIELD MEASURING SYSTEM

RELATED APPLICATIONS

This application is a national phase entry of international patent application PCT/JP2018/040099 filed Oct. 29, 2018, which claims benefit of priority to Japanese Application Serial No. 2017-215720, filed Nov. 8, 2017, the entire disclosures of which are incorporated herein by reference in their entireties.

TECHNICAL FIELD

The present invention relates to technology for a magnetic field measuring element, a magnetic field measuring device, and a magnetic field measuring system using a plurality of SQUID magnetic sensors.

BACKGROUND ART

SQUID (Superconducting QUantum Interference Device) magnetic sensors are magnetic sensors using superconductivity. Thus, the SQUID magnetic sensors are used while cooled to a superconducting critical temperature or lower by using a liquid refrigerant such as liquid helium or liquid nitrogen or by using, for instance, a freezer.

FIG. 31 is a schematic diagram of a common SQUID magnetic sensor 1.

The SQUID magnetic sensor 1 is a magnetic flux-voltage conversion element, the output voltage of which can be changed by a superconducting loop-interlinked magnetic flux.

Each SQUID magnetic sensor 1 is structured by including either one or two Josephson junction portions 2 on a closed loop (superconducting loop) called a SQUID inductor 8.

The SQUID magnetic sensor 1, shown in FIG. 31, uses a SQUID including two Josephson junction portions 2 on a superconducting loop (SQUID inductor 8). Such a SQUID is referred to as a dc-SQUID and has been widely used.

The SQUID inductor 8 has a very small area and, by itself, has thus a small magnetic flux capturing area. Here, as shown in FIG. 31, a detection coil 3, which usually has a large magnetic flux capturing area, is connected to the SQUID inductor 8. Then, a magnetic flux interlinked with the detection coil 3 is conducted to the SQUID inductor 8. This makes it possible to use the SQUID magnetic sensor 1 as a high-sensitivity magnetic sensor. Typically, the detection coil 3 is also formed using a superconductor (superconductive material).

In a SQUID magnetic sensor 1 made of a low-temperature superconductor requiring liquid helium, a detection coil 3 can be manufactured using a superconductive wire made of, for instance, Nb or NbTi. Meanwhile, in the case of a high temperature superconducting SQUID that uses a $YBa_2Cu_3O_x$ oxide conductor as a superconductor and can be operated in liquid nitrogen, inter-superconductor junction technology has yet to be developed. That is, technology for joining a superconductive wire (detection coil 3) and a SQUID inductor 8 has yet to be developed. Thus, it is common to integrate, using a thin film deposition process, the detection coil 3 and the SQUID inductor 8 on the same substrate. Note that because FIG. 31 is schematically illustrated, the detection coil 3 and the SQUID inductor 8 appear to be joined, but are integrated actually. The sensitive detection direction of the SQUID magnetic sensor 1 in which the detection coil 3 and the SQUID inductor 8 are integrated is a direction perpendicular to a substrate surface on which the SQUID magnetic sensor 1 is formed. That is, a magnetic flux interlinked with the detection coil 3 is detected.

In the case of a dc-SQUID, a bias current which exceeds a Josephson junction critical current value, flows between two Josephson junction portions 2 to generate a voltage $V_{SQUID}$ as an output. In the SQUID magnetic sensor 1 shown in FIG. 31, a current flows from terminals 4 to terminals 5, and a voltage between the terminals 4 and the terminals 5 are read.

Note that a feedback coil 6 and terminals 7 will be described later.

FIGS. 32 and 33 are charts illustrating voltage-magnetic flux characteristics (V-Φ characteristics) of the SQUID magnetic sensor 1.

Note that the "voltage" in FIG. 32 and below-described FIG. 33 refers to an output voltage of the SQUID magnetic sensor 1. See FIG. 31, if appropriate.

As shown in FIG. 32, the output voltage of the SQUID magnetic sensor 1 fluctuates like a sine wave with respect to a magnetic flux interlinked with the detection coil 3 and the SQUID inductor 8. A magnetic flux in a perfect superconducting loop is subject to quantization and the magnetic flux is only present as a magnetic flux quantum $\Phi_0 (= 2.05 \times 10^{-15}$ Wb) unit(s). However, the SQUID inductor 8 is cut at the Josephson junction portions 2, so that any magnetic flux can be interlinked. However, the resulting output voltage exhibits a fluctuation with respect to the interlinked magnetic flux while having a cycle of $\Phi_0$.

To obtain an output proportional to the interlinked magnetic flux from the periodic nonlinear characteristic, the SQUID magnetic sensor 1 is controlled by feedback control. As used herein, the "non-linear" means that the voltage and the magnetic flux do not have a simple proportional correlation. That is, as shown in FIG. 32, for instance, regarding the output voltage of the SQUID magnetic sensor 1, the voltage is not simply proportional to the magnetic flux. Thus, it is difficult to determine an applied magnetic flux from the voltage. Specifically, a feedback magnetic field that cancels the magnetic flux interlinked with the detection coil 3 is applied to the feedback coil 6. Such a feedback magnetic field is used to control the SQUID magnetic sensor 1 such that the output voltage is not shifted from a certain point (lock point P) of the V-Φ characteristic. The lock point P is detailed later. A control circuit used for such feedback control is called an FLL (Flux Locked Loop) circuit 21 (see FIG. 34). The FLL circuit 21 has several circuit types.

FIG. 34 shows, as an example, a basic configuration of the FLL circuit 21 of DOIT (Direct Offset Integration Technique) type.

The output voltage $V_{SQUID}$ (voltage between the terminals 4 and the terminals 5 in FIG. 31) of the SQUID magnetic sensor 1 is amplified using a pre-amplifier 211 and a negative DC output voltage $V_{offset}$ is then added using an adder 212. Note that hereinafter, the voltage between the terminals 4 and the terminals 5 is designated, if appropriate, as the "terminal 5 output". This configuration can be used to adjust (offset), as shown in FIG. 33, the SQUID magnetic sensor 1 such that the V-Φ characteristic fluctuates across the position at 0 V. Note that the FLL circuit 21 of DOIT type, as shown in FIG. 34, is detailed later. The lock point P is described below.

Here, the details of the FLL circuit 21 of DOIT type are illustrated with reference to FIG. 34.

As described above, the output voltage $V_{SQUID}$ (terminal 5 output in FIG. 31) of the SQUID magnetic sensor 1 is amplified using the pre-amplifier 211 and the negative DC output voltage $V_{offset}$ is then added using the adder 212.

The output of the adder 212 is integrated in an integrator 213. The output of the integrator 213 is output via a feedback resistor 214 to the feedback coil 6. In the SQUID magnetic sensor 1 shown in FIG. 31, the feedback coil 6 having the terminals 7 is arranged so as to be magnetically linked to the detection coil 3. That is, the magnetic field occurring in the feedback coil 6 is interlinked with the detection coil 3. Note that the terminals 7 in FIG. 31 are connected to the FLL circuit 21.

As described above, the feedback coil 6 is magnetically linked via the detection coil 3 to the SQUID inductor 8. As such, the output of the integrator 213 is feedbacked. In this way, when the output voltage of the adder 212 is not zero, the output of the integrator 213 is applied, as the feedback magnetic field via the feedback coil 6, to the detection coil 3. The feedback magnetic field is applied to the detection coil 3 until the output voltage of the adder 212 becomes zero. When a magnetic flux coming into the detection coil 3 and the SQUID inductor 8 is changed upon a change in the outside magnetic field, the output of the SQUID magnetic sensor 1, namely the output of the adder 212 is also changed. Then, a current flows in the feedback coil 6 such that the output of the adder 212 reaches zero, and a feedback magnetic field is so applied.

As a result, the SQUID state is locked at any one of points (lock points P) across the 0 V voltage line in the V-Φ characteristic after the offset voltage adjustment shown in FIG. 33. That is, regarding the feedback magnetic field, even after a change in the outside magnetic field of the SQUID magnetic sensor 1, the feedback magnetic field that cancels the change is applied to the detection coil 3. Specifically, when the output of the SQUID magnetic sensor 1 is deviated from the lock point P, the feedback magnetic field is applied to the detection coil 3 such that the output is returned to the lock point I' as shown in the arrows in FIG. 33.

The magnetic flux interlinked with the detection coil 3 can be determined by measuring such a feedback magnetic field. This feedback magnetic field is proportional (linearly correlated) to the output Vout of the integrator 213, so that it is easy to estimate the feedback magnetic field from the output Vout of the integrator 213. That is, the terminal 4/terminal 5 output is not directly measured, but it is possible to measure a voltage applied to the feedback resistor 214 serially connected to the feedback coil 6. This makes it possible to measure the magnetic flux interlinked with the detection coil 3. In this way, the non-linear V-Φ characteristic can be converted to a linear characteristic as shown in FIGS. 32 and 33. Thus, the output voltage of the SQUID magnetic sensor 1 can be determined from the magnetic flux measured.

Note that the feedback coil 6 is not necessarily a superconductor.

A reset switch 215 in FIG. 34 is a switch in which a capacitor of the integrator 213 can be short-circuited to return the output of the integrator 213 to 0. In addition, a feedback switch 216 is a switch in which the connection between the output of the integrator 213 and the feedback coil 6 is switched.

Regarding a Nb-based superconductor (low-temperature superconductor) requiring liquid helium cooling, for instance, a technology for manufacturing a complicated micro-circuit including a multi-layered superconductor layer has been completed. Because of this, in the Nb-based superconductor, for instance, the feedback coil 6 is often formed on the same substrate as of the SQUID inductor 8. In such a Nb-based superconductor, it is common to use a process for applying a feedback magnetic field to the SQUID inductor 8 by using the feedback coil 6 having substantially the same size as of the SQUID inductor 8.

Meanwhile, regarding high-temperature superconductors that can be operated in liquid nitrogen, a multilayer stricture process becomes increasingly difficult. Thus, it is not carried out to fabricate the feedback coil 6 on the same substrate as of the SQUID inductor 8. A method is common in which a substrate having the SQUID inductor 8 and/or the detection coil 3 is mounted on a substrate having the feedback coil 6. In this case, the feedback magnetic field is not directly applied to the SQUID inductor 8, but it is common to use a method in which the feedback magnetic field is applied to the detection coil 3 as shown in FIG. 31.

It is conventional to combine three magnetic sensors, such as fluxgate magnetometers or SQUID magnetometers, that each detect a magnetic flux only in a specific axial direction. This configuration allows for simultaneous measurement of three-component (x, y, and z) magnetic fluxes by arranging the magnetic sensors such that the respective central axes are perpendicular to one another. Regarding the three-magnetic sensor arrangement, it is typically arranged such that the central axes of the three magnetic sensors intersect at one point. A cube, the center of which is the point of intersection among the central axes of the three magnetic sensors, is considered. Here, the three sensors are disposed on three sides of the cube. This arrangement is herein called cubic arrangement.

In addition, the three magnetic sensors are often arranged on a line. This arrangement is herein called coaxial arrangement. Another arrangement has also been known in which the three magnetic sensors are simply aligned on the same plane.

SUMMARY OF INVENTION

Technical Problem

The SQUID magnetic sensor 1 is usually cooled with a liquid refrigerant. Then, the SQUID magnetic sensor 1 is desirably placed in vicinity of the bottom surface of a cryostat containing the liquid refrigerant. This is because a smaller amount of liquid refrigerant is used for cooling or the same amount of liquid refrigerant is used to maintain the SQUID magnetic sensor 1 in a low-temperature state for a longer period. In addition, in order to reduce a heat influx from an opening portion of a cryostat to prolong a cooling period, a smaller opening portion of the cryostat is desirable. Because of this, compact arrangement of a plurality of SQUID magnetic sensors 1 is sought.

The individual SQUID magnetic sensors 1 each have the detection coil 3 and the feedback coil 6 to which the feedback magnetic field is applied as described above in FIG. 31. When the plurality of SQUID magnetic sensors 1 are compactly arranged, this configuration causes a problem of interference between the feedback magnetic fields and the detection coils 3 of adjacent other SQUID magnetic sensors 1. In common methods in which a feedback magnetic field is applied to the detection coil 3 in the SQUID magnetic sensor 1 using, in particular, a high-temperature superconductor, the feedback coil 6 should have a size of several mm to several cm. When the feedback coil 6 has such a size, the feedback magnetic field is spatially extended and as a result of which the interference is marked.

From the viewpoint of placing the SQUID magnetic sensors 1 in vicinity of the bottom surface of a liquid refrigerant-containing cryostat, cubic arrangement is effective.

FIG. 35 is a schematic diagram illustrating, as an example, the case of cubic arrangement in which SQUID magnetic sensors 1x to 1z (1) are arranged on three sides of a cubic support body 301.

Each SQUID magnetic sensor 1 includes the detection coil 3 and the feedback coil 6 as shown in FIG. 31. As illustrated in FIG. 35, in the cubic arrangement, the total height is about the height of the SQUID magnetic sensor 1 arranged vertically. Then, in the cubic arrangement as illustrated in FIG. 35, for instance, magnetic field lines Mz1 and Mz2 of the feedback magnetic field of the SQUID magnetic sensor 1z interfere with the detection coils 3 of the other SQUID magnetic sensors 1x and 1y. Regarding the other SQUID magnetic sensors 1, similar interference also occurs.

Meanwhile, FIG. 36 is a diagram illustrating an example of coaxial arrangement.

In the coaxial arrangement as illustrated in FIG. 36, the centers of three SQUID magnetic sensors 1x to 1z (1) are arranged (linearly arranged) on a straight line through the central axis Cz of the SQUID magnetic sensor 1z. Further, the detection planes of the three SQUID magnetic sensors 1x to 1z are perpendicular to one another. Such arrangement, namely coaxial arrangement, makes it possible to realize such that the feedback magnetic field of one SQUID magnetic sensor 1 does not interfere with the detection coils 3 of the other SQUID magnetic sensors 1.

For instance, as illustrated in FIG. 36, a magnetic field line Mx1 from the feedback coil 6 of the middle SQUID magnetic sensor 1x comes in parallel to the detection plane of the SQUID magnetic sensor 1y. Specifically, the plane created by the magnetic field line Mx1 is in parallel relation to the plane of the SQUID magnetic sensor 1y. Because of this, the magnetic field line Mx1 is not interlinked with the detection coil 3 of the SQUID magnetic sensor 1y. As used herein, such positional relation between the SQUID magnetic sensors 1x and 1y in FIG. 36 is referred to as "parallel relation".

In addition, in FIG. 36, a magnetic field line Mx2 comes in the detection coil 3 of the SQUID magnetic sensor 1z and the magnetic field line Mx2 goes out at the same level due to left-right symmetry. That is, the magnetic field line Mx2 comes in and then goes out from the detection coil 3 of the SQUID magnetic sensor 1z. Because of this, the net magnetic field is undetected. As such, the magnetic field line Mx2 is interlinked with the detection coil 3 of the SQUID magnetic sensor 1z and the magnetic field line Mx2 goes out at the same level, so that there is no net magnetic field line Mx2 interlinkage. Such positional relation is referred to as "symmetric relation".

In addition, although not depicted, the SQUID magnetic sensor 1z is in parallel relation to the SQUID magnetic sensors 1x and 1y. Further, the SQUID magnetic sensor 1y is in parallel relation to the SQUID magnetic sensor 1x and is in symmetric relation to the SQUID magnetic sensor 1z.

In the coaxial arrangement type, less feedback magnetic field interference occurs. However, because of the vertical arrangement, the top SQUID magnetic sensor 1 (SQUID magnetic sensor 1y in FIG. 36) is apart farther from the bottom surface of the cryostat. As described above, the SQUID magnetic sensors 1 are submerged in a liquid refrigerant. Here, the liquid refrigerant is evaporated during use of the SQUID magnetic sensors 1. In the coaxial arrangement type, the top SQUID magnetic sensor 1 (SQUID magnetic sensor 1y in FIG. 36) is going to be exposed over the liquid refrigerant at earlier timing. This necessitates frequent refills of the liquid refrigerant, thereby decreasing liquid refrigerant utilization efficiency.

In addition, as the size in the vertical direction increases when the coaxial arrangement is applied, the size in the horizontal direction of an apparatus (cryostat) should be made longer in view of stability. This causes the apparatus to become bigger, thereby reducing portability.

Here, when the cubic arrangement is deployed horizontally, the three SQUID magnetic sensors 1 may be housed at the same height as of cubic arrangement. Unfortunately, when the coaxial arrangement is deployed horizontally, the width of the cryostat becomes large. This causes an increase in heat influx, thereby making the apparatus bigger. Due to the above, it is not a desirable method to horizontally deploy the coaxial arrangement.

The present invention has been made in view of such a background. The invention addresses the problem of lowering the height of a magnetic field measuring element while decreasing interference.

Solution to Problem

To solve the problem, the present invention provides a magnetic field measuring element comprising at least three SQUID magnetic sensors, each comprising a detection coil made of a superconductive material, a SQUID inductor that is connected to the detection coil and is made of the superconductive material having a Josephson junction portion, and a feedback coil generating a feedback magnetic field in the detection coil, the sensors comprising:

a first SQUID magnetic sensor;

a second SQUID magnetic sensor disposed either on a second plane which is perpendicular to a first plane including a coil surface of a detection coil of the first SQUID magnetic sensor and which includes a center of the first SQUID magnetic sensor, or in vicinity of the second plane; and a third SQUID magnetic sensor having a detection coil disposed either on a third plane which is perpendicular to the first plane and the second plane and which includes the center of the detection coil of the first SQUID magnetic sensor, or in vicinity of the third plane, wherein a center of a detection coil of the second SQUID magnetic sensor is present on a straight line which passes through the center of the detection coil of the first SQUID magnetic sensor and is perpendicular to the first plane, or in vicinity of the straight line, and a center of the detection coil of the third SQUID magnetic sensor is present in a position displaced from a line joining the center of the detection coil of the first SQUID magnetic sensor and the center of the detection coil of the second SQUID magnetic sensor.

Other solutions are described, if appropriate, in embodiments.

Advantageous Effects of Invention

The invention makes it possible to lower a height while decreasing interference.

BRIEF DESCRIPTION OF DRAWINGS

FIG. 18 is a table showing the strength of interference with each SQUID magnetic sensor 1 under the arrangement in the comparative example.

FIG. 19 is a table showing the strength of interference with each SQUID magnetic sensor 1 under the arrangement in FIGS. 13 and 14.

DESCRIPTION OF EMBODIMENTS

Hereinafter, embodiments of the invention (hereinafter, referred to as "embodiments") are described in detail with reference to the Drawings, if appropriate.

First Embodiment (Configuration of Magnetic Field Measuring Element E)

Figure 1:
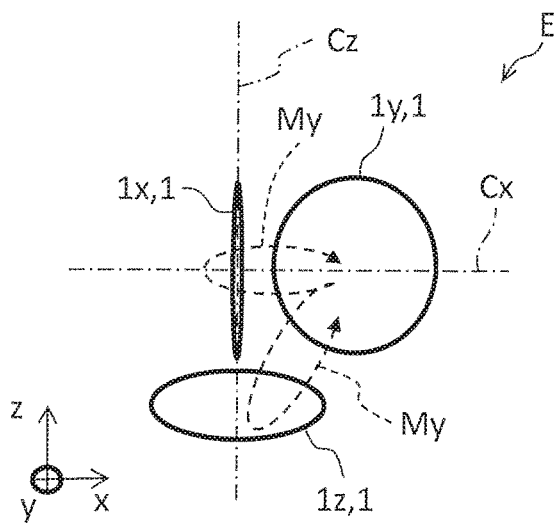
FIG. 1 is a diagram (No. 1) illustrating an example of arrangement of coils in a magnetic field measuring element E according to a first embodiment.
Figure 2:
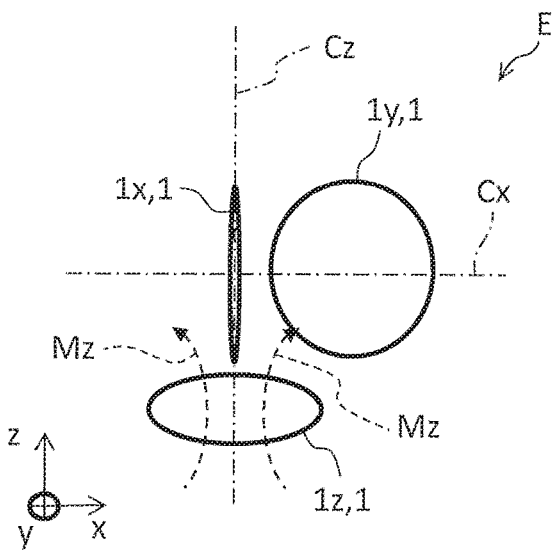
FIG. 2 is a diagram (No. 2) illustrating an example of arrangement of coils in the magnetic field measuring element E according to the first embodiment.
Figure 3:
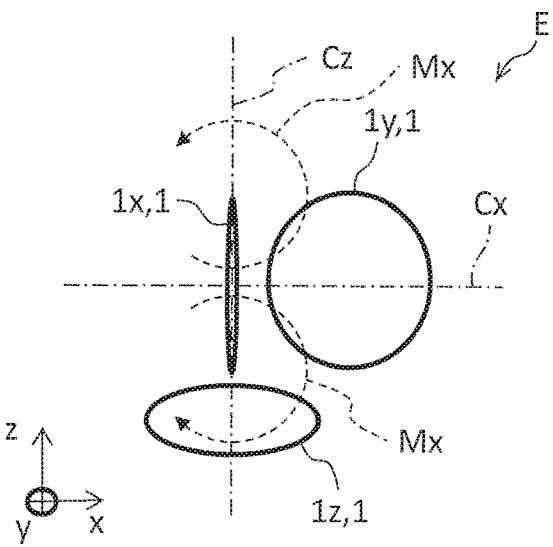
FIG. 3 is a diagram (No. 3) illustrating an example of arrangement of coils in the magnetic field measuring element E according to the first embodiment.

FIGS. 1 to 3 are diagrams each illustrating an example of arrangement of coils in a magnetic field measuring element E according to a first embodiment. Note that in FIGS. 1 to 4, SQUID magnetic sensors 1x to 1z represent detection coils 3 and the other components are omitted so as to make it easy to understand the pictures. In addition, each SQUID magnetic sensor 1 has substantially the same structure as of FIG. 31.

The SQUID magnetic sensor 1z (1), which is the first SQUID magnetic sensor, is disposed on a plane (first plane) perpendicular to the z axis. Specifically, the SQUID magnetic sensor 1z is horizontally placed with respect to the ground. The SQUID magnetic sensor 1x (1), which is the second SQUID magnetic sensor, is disposed on the central axis Cz that extends, from the center of the SQUID magnetic sensor 1z, vertically with respect to the detection plane of the SQUID magnetic sensor 1z.

Specifically, the SQUID magnetic sensor 1x is present on a second plane that is a plane perpendicular to the first plane, which is the coil surface of the SQUID magnetic sensor 1z, and contains the center of the SQUID magnetic sensor 1z.

Here, the central axis Cz is a straight line that passes through the center of the SQUID magnetic sensor 1z, present on the second plane, and is perpendicular to the first plane. Then, the SQUID magnetic sensor 1x is disposed such that the center of the SQUID magnetic sensor 1x is present on the central axis Cz. Provided that the SQUID magnetic sensor 1x may be present at a position somewhat displaced from the second plane. Likewise, the center of the SQUID magnetic sensor 1x may be present at a position somewhat displaced from the central axis Cz.

The SQUID magnetic sensor 1y (1), which is the third SQUID magnetic sensor, is disposed in a third plane that is perpendicular to the first and second planes and contain the central axis Cx extending perpendicularly from the center of the SQUID magnetic sensor 1x.

Specifically, the plane, which is the coil surface of the SQUID magnetic sensor 1z, is the first plane and the plane, which is the coil surface of the SQUID magnetic sensor 1x, is the second plane. Then, the third plane is the plane perpendicular to the first and second planes and the SQUID magnetic sensor 1y is disposed such that the plane, which is the coil surface of the SQUID magnetic sensor 1y, is present on the third plane.

At this time, the SQUID magnetic sensor 1y is arranged such that the center of the SQUID magnetic sensor 1y is disposed at a position other than on the central axis Cz (at a position displaced from the central axis Cz).

In the example of FIGS. 1 to 3, the SQUID magnetic sensor 1y is disposed such that the center thereof is present on the central axis Cx. Provided that the SQUID magnetic sensor 1y may be present at a position somewhat displaced from the third plane. Likewise, the center of the SQUID magnetic sensor 1y may be present at a position somewhat displaced from the central axis Cx.

Further, as described below in FIG. 4, the center of the SQUID magnetic sensor 1y may be present between the central axis Cx and the first plane.

(Magnetic Flux Interlinkage State)

Dashed lines shown in FIG. 1 denote magnetic field lines My of the feedback magnetic field occurring in the SQUID magnetic sensor 1y.

First, as illustrated in FIG. 1, the SQUID magnetic sensor 1y is in symmetric relation to the SQUID magnetic sensors 1z and 1x.

Specifically, as illustrated in FIG. 1, magnetic fluxes caused by the magnetic field occurring in the SQUID magnetic sensor 1y comes in the SQUID magnetic sensors 1z and 1x. However, these magnetic fluxes also go out from the SQUID magnetic sensors 1z and 1x. That is, it is evident that no net magnetic flux interlinkage occurs.

In addition, dashed lines shown in FIG. 2 denote magnetic field lines Mz of the feedback magnetic field occurring in the SQUID magnetic sensor 1z.

Next, as illustrated in FIG. 2, the SQUID magnetic sensor 1z is in parallel relation to the SQUID magnetic sensors 1x and 1y.

Specifically, magnetic fluxes occurring in the SQUID magnetic sensor 1z are not interlinked with the SQUID magnetic sensors 1y and 1x.

Then, dashed lines shown in FIG. 3 denote magnetic field lines Mx of the feedback magnetic field occurring in the SQUID magnetic sensor 1x.

As illustrated in FIG. 3, the SQUID magnetic sensor 1x is in symmetric relation to the SQUID magnetic sensor 1z. Because of this, the magnetic fluxes induced by the magnetic field occurring in the SQUID magnetic sensor 1x cause no net magnetic flux interlinkage with respect to the SQUID magnetic sensor 1z.

In addition, the SQUID magnetic sensor 1x is in parallel relation to the SQUID magnetic sensor 1y. Because of this, the magnetic fluxes induced by the magnetic field occurring in the SQUID magnetic sensor 1x is not interlinked with the SQUID magnetic sensor 1y.

As such, according to the coil arrangement illustrated in FIGS. 1 to 3, the three SQUID magnetic sensors 1x to 1z are in parallel relation or in symmetric relation to one another. In view of this, the arrangement illustrated in FIGS. 1 to 3 is an arrangement in which no reciprocal feedback magnetic field interference occurs.

This enables the magnetic field measuring element E shown in FIGS. 1 to 3 to have markedly decreased feedback magnetic field interference among the SQUID magnetic sensors 1x to 1x.

In the magnetic field measuring element E according to the first embodiment, the height of the magnetic field measuring element E can be lowered while the interference between the SQUID magnetic sensors 1 is decreased. This makes it possible to increase the number of effective SQUID magnetic sensors 1 while decreasing the interference between the SQUID magnetic sensors 1 even if the liquid level of a liquid refrigerant is lowered due to its evaporation.

In addition, a magnetic field measuring unit (cryostat) 10 (FIG. 5) can be made smaller while keeping low the interference between the SQUID magnetic sensors 1. This allows for the magnetic field measuring unit (cryostat) 10 (FIG. 5) with little interference between the SQUID magnetic sensors 1 while maintaining portability.

Figure 31:
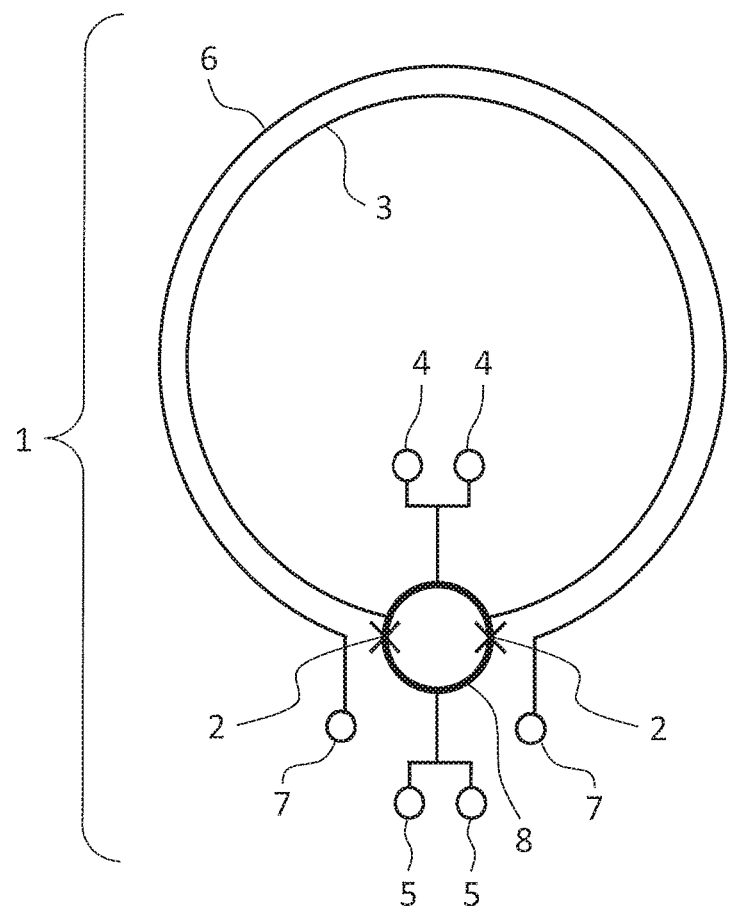
FIG. 31 is a schematic diagram of a common SQUID magnetic sensor 1.
Figure 32:
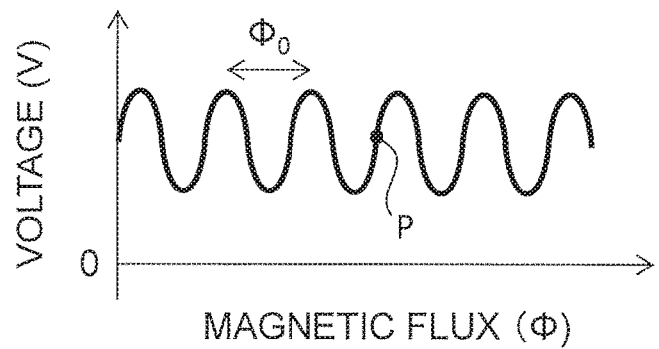
FIG. 32 is a chart (before offsetting) illustrating a voltage-magnetic flux characteristic (V-Φ characteristic) of the SQUID magnetic sensor 1.
Figure 33:
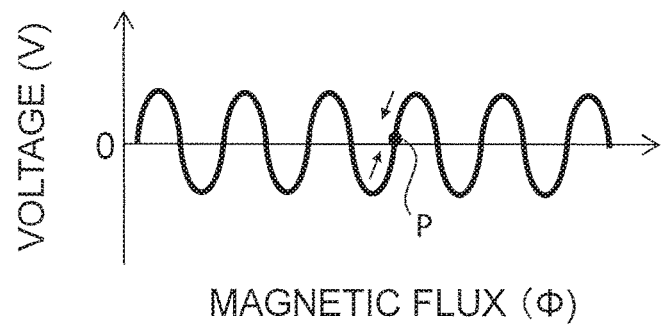
FIG. 33 is a chart (after offsetting) illustrating a voltage-magnetic flux characteristic (V-Φ characteristic) of the SQUID magnetic sensor 1.

Further, in the first embodiment, the SQUID magnetic sensors 1 shown in FIG. 31 are used for the magnetic field measuring element E. This configuration makes it possible to lower the height of the magnetic field measuring element E while decreasing the interference in the magnetic field measuring element E structured by the SQUID magnetic sensors 1 using low-temperature superconducting devices.

Second Embodiment

Figure 4:
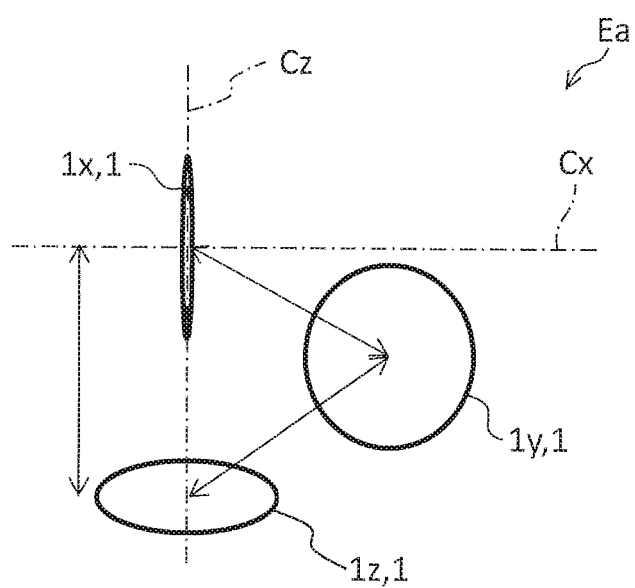
FIG. 4 is a diagram illustrating positional relation between SQUID magnetic sensors 1 in a magnetic field measuring element Ea according to a second embodiment.

FIG. 4 is a diagram illustrating positional relation between SQUID magnetic sensors 1 in a magnetic field measuring element Ea according to a second embodiment.

In the magnetic field measuring element E shown in FIGS. 1 to 3, the SQUID magnetic sensors 1x and 1y are disposed at the same height relative to the SQUID magnetic sensor 1z. Specifically, the center of the SQUID magnetic sensor 1y is disposed on the central axis Cx. As such, the height of the whole magnetic field measuring element E shown in FIGS. 1 to 3 is made lower. That is, in the magnetic field measuring element E shown in FIGS. 1 to 3, the SQUID magnetic sensors 1x to 1z are arranged so as to equal the distance from the bottom surface of the magnetic field measuring element E (the coil surface of the SQUID magnetic sensor 1z) to the upper end of each of the SQUID magnetic sensors 1x and 1y. However, the arrangement is acceptable as long as the respective SQUID magnetic sensors 1 are in parallel relation or in symmetric relation to one another as illustrated in FIGS. 1 to 3. Thus, the effects of the magnetic field measuring element E shown in FIGS. 1 to 3 can be exerted even when the SQUID magnetic sensors 1x and 1y are not arranged at the same height relative to the coil surface of the SQUID magnetic sensor 1z.

For instance, the magnetic field measuring element Ea may be arranged, as illustrated in FIG. 4, such that the distance between the respective three SQUID magnetic sensors 1x to 1z is the same.

Specifically, in the magnetic field measuring element Ea shown in FIG. 4, the positional relation between the SQUID magnetic sensors 1z and 1x is like the one illustrated in FIGS. 1 to 3. In addition, the SQUID magnetic sensor 1y is disposed on the third plane like FIGS. 1 to 3 (on the plane perpendicular to the plane, which is the coil surface of the SQUID magnetic sensor 1z, and the plane, which is the coil surface of the SQUID magnetic sensor 1x). In this regard, however, the center of the SQUID magnetic sensor 1y is displaced from the central axis Cx so as to equal the distances between the respective centers of the three SQUID magnetic sensors 1x to 1z.

Such a configuration can elongate the distances between the SQUID magnetic sensors 1. As the distances between the SQUID magnetic sensors 1 are made larger, the interference between the SQUID magnetic sensors 1 can be made smaller. Note that the following describes that as the distances between the SQUID magnetic sensors 1 are made larger, the interference between the SQUID magnetic sensors 1 can be made smaller.

Third Embodiment (Magnetic Field Measuring System Z)

Figure 5:
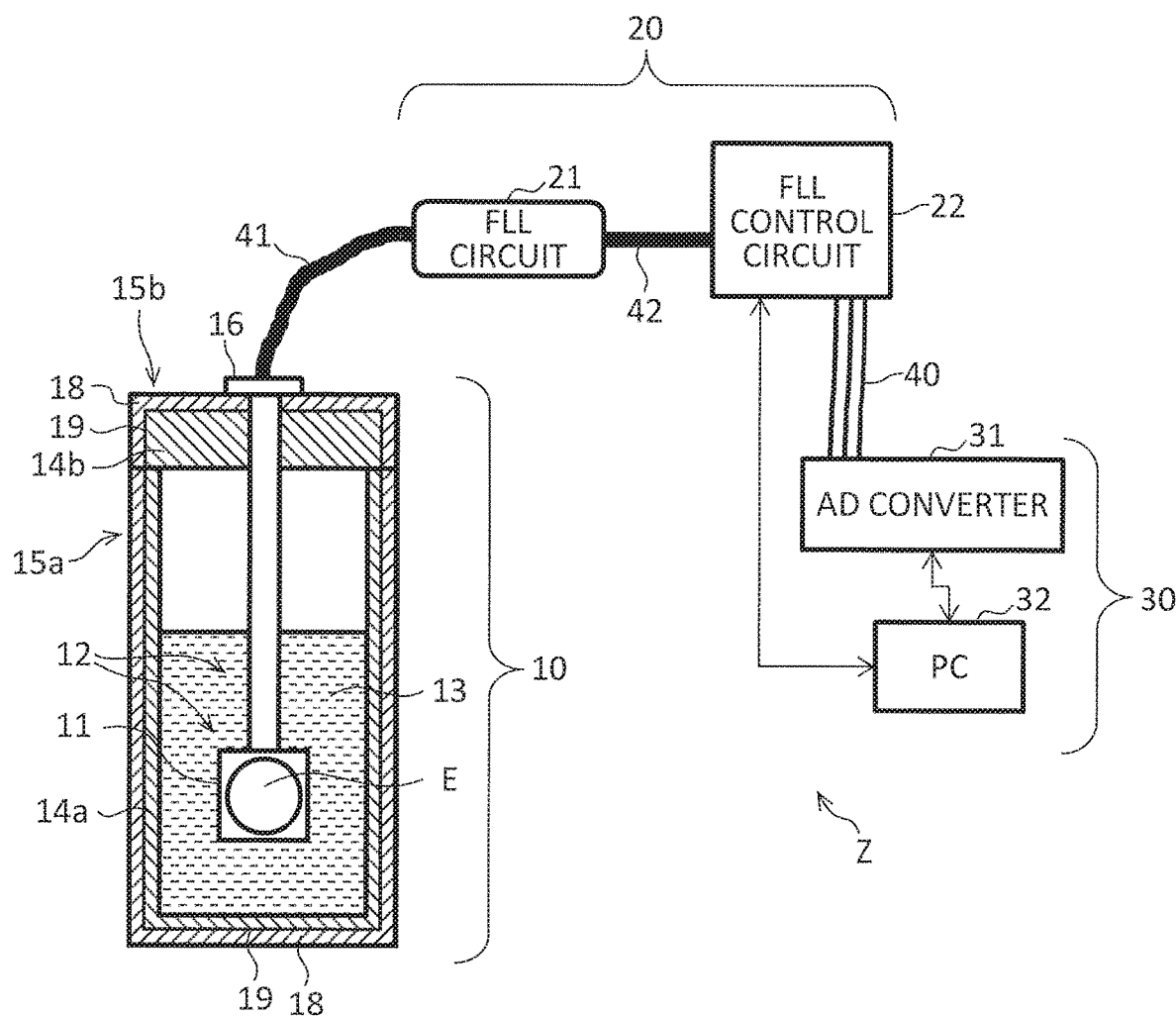
FIG. 5 illustrates function blocks as a configuration example of a magnetic field measuring system Z according to an embodiment of the invention.

FIG. 5 illustrates function blocks as a configuration example of a magnetic field measuring system Z according to an embodiment of the invention.

The magnetic field measuring system Z includes a magnetic field measuring unit (magnetic field measuring device) 10, which is a cryostat, a control circuit unit 20, and a data processing unit 30. Note that in FIG. 5, the magnetic field measuring unit 10 is represented by a schematic cross-sectional view.

The magnetic field measuring unit 10 includes a magnetic field measuring element E having, as components, a plurality of SQUID magnetic sensors 1 for measuring a magnetic flux.

In addition, the control circuit unit 20 is to control the magnetic field measuring unit 10 and has an FLL circuit 21 and an FLL control circuit 22. The FLL circuit 21 and the FLL control circuit 22 will be described below.

Further, the data processing unit 30 is to record magnetic signals, detected by the magnetic field measuring unit 10, for calculation/analysis processing. The data processing unit 30 has an AD (Analog/Digital) converter 31 and a PC (Personal Computer) 32. Note that although not depicted in FIG. 5, a filter circuit and/or an amplification circuit (not shown) may be inserted before the AD converter 31 if necessary.

The magnetic field measuring unit 10 has the magnetic field measuring element E including the three SQUID magnetic sensors 1x to 1z having detection axes in respective three different directions as shown in FIGS. 1 to 4. Further, the magnetic field measuring unit 10 has a probe 12 that holds the magnetic field measuring element E. In addition, the magnetic field measuring unit 10 has a lid 15b and a container 15a for retaining a liquid refrigerant 13 with which the respective SQUID magnetic sensors 1x to 1z are cooled. The container 15a has a liquid refrigerant retaining member 14a, which is a thermally insulated vacuum container, on the inner-most side. Then, the outside of the liquid refrigerant retaining member 14a is provided with an outer case 18, In addition, an electromagnetic shielding fabric 19 for cutting high-frequency component signals is placed between the outer case 18 and the liquid refrigerant retaining member 14a. The inner side of the outer case 18 of the lid 15b is provided with the electromagnetic shielding fabric 19 and the further inner side is provided with an insulator 14b made of, for instance, polyethylene foam. Such a structure can shield the whole inside of the magnetic field measuring unit (cryostat) 10 from high frequency noise.

Specifically, the SQUID magnetic sensors 1x to 1z included in the magnetic field measuring element E are fixed to and held by a probe head 11 at the tip of the probe 12.

In addition, liquid nitrogen is used as the liquid refrigerant 13. The probe 12 is inserted into the liquid refrigerant retaining member 14a in which the liquid refrigerant 13 is kept. Such a configuration can be used to cool the magnetic field measuring element E (SQUID magnetic sensors 1z to 1z) mounted on the probe head 11 at a tip portion of the probe 12, The probe 12 is connected to the FLL circuit 21 via a cable 41 that has a predetermined length (e.g., about 1 m) and is connected to connectors 16 on the lid 15b.

Figure 34:
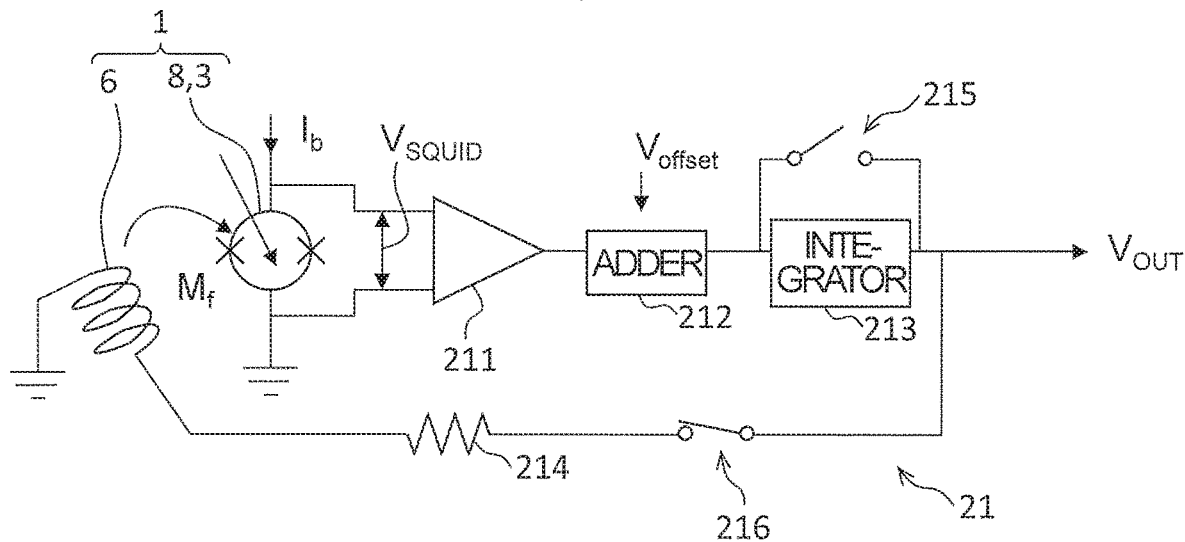
FIG. 34 is a diagram illustrating a basic configuration of an FLL circuit 21 of DOIT (Direct Offset Integration Technique) type.
Figure 35:
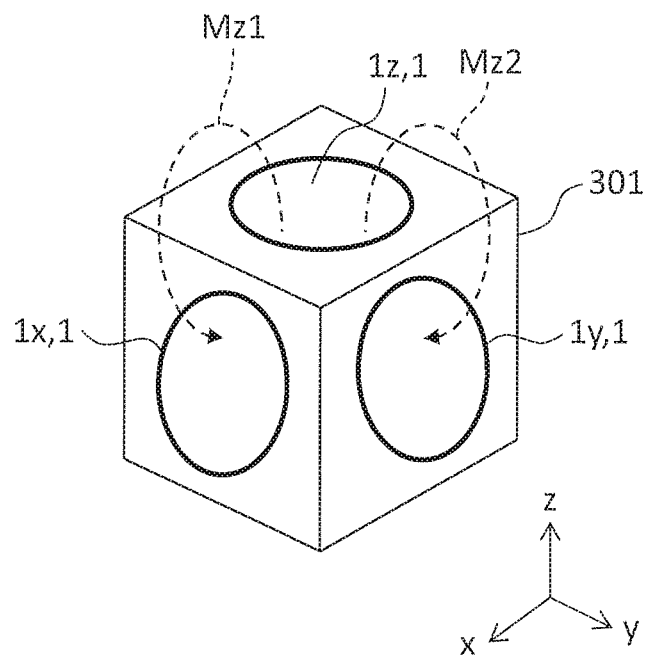
FIG. 35 is a diagram illustrating an example of cubic arrangement.
Figure 36:
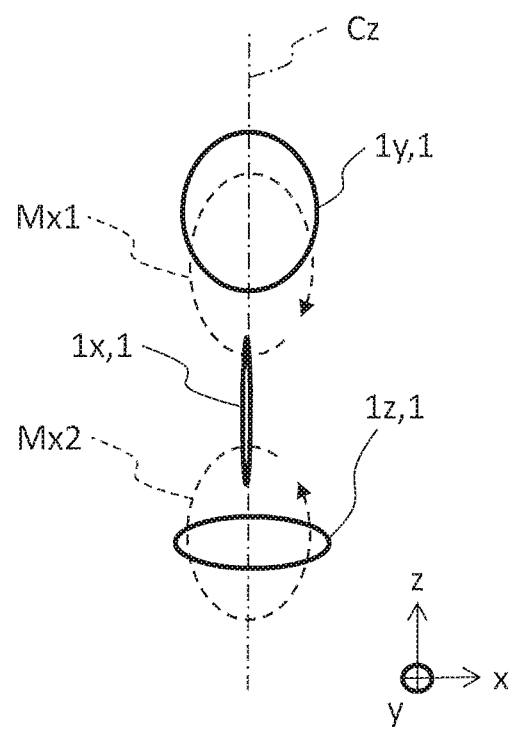
FIG. 36 is a diagram illustrating an example of coaxial arrangement.

The FLL circuit 21 has already been described in FIG. 34 and the description is omitted here. The FLL control circuit 22 is a circuit for controlling FLL. Further, the FLL control circuit 22 outputs the output of the integrator 213 of the FLL circuit 21 (see FIG. 34) to the AD converter 31.

Note that the FLL circuit 21 is connected, using a cable 42 with a predetermined length (e,g., about 30 m), to the FLL control circuit 22.

The FLL control circuit 22 outputs, as analog signals, for instance, three-component magnetic signals. Each analog signal is input, via a cable 40, into the AD converter 31, The AD converter 31 is used to convert, the analog signal to a digital signal, which is then input into the PC 32. Data is stored in a hard disk (not shown) of the PC 32. The PC 32 transmits parameter adjusting information to the FLL control circuit 22.

The following shows an example in which the magnetic field measuring element E in this embodiment is applied to a three-component magnetometer for metal resource exploration.

This three-component magnetometer can be used for measurement of the specific resistance distribution under the ground by TEM (Transient Electro-Magnetic) method. In the TEM method, a loop coil, the side size of which is several hundred m, is laid on the ground surface, and a large current of several dozen A is made to flow through this loop coil. As such, a magnetic field (primary magnetic field) is applied onto the ground surface. Then, a current is shut off from this state. When the current applied to the loop coil is shut off, an induced current occurs on the ground surface and the induced current propagates in the ground as time has passed. The magnetic field measuring element E is used to measure a magnetic flux caused by a magnetic field (secondary magnetic field) due to the induced current occurring on the ground surface. Then, the underground specific resistance structure can be estimated from its attenuation characteristic. The resulting specific resistance structure is used to estimate the presence or absence and/or the distribution of metallic ore deposit under the ground. The mainstream in the previous TEM method is a method for measuring just a component in the vertical direction (z direction) of the magnetic flux caused by the secondary magnetic field. However, it has recently been tried to measure horizontal components, which are magnetic fluxes in the x and y directions, to increase estimation accuracy of the underground structure. In the TEM method, the intensity (magnetic flux) of the magnetic field in the vertical direction with respect to the ground is strong while the intensities of magnetic fields in the horizontal directions are several orders smaller than in the vertical direction. This causes a big problem when the magnetic field component in the z direction interferes with the magnetic field components in the horizontal directions. A solution to this problem will be described later.

(SQUID Chip 100)

Figure 6:
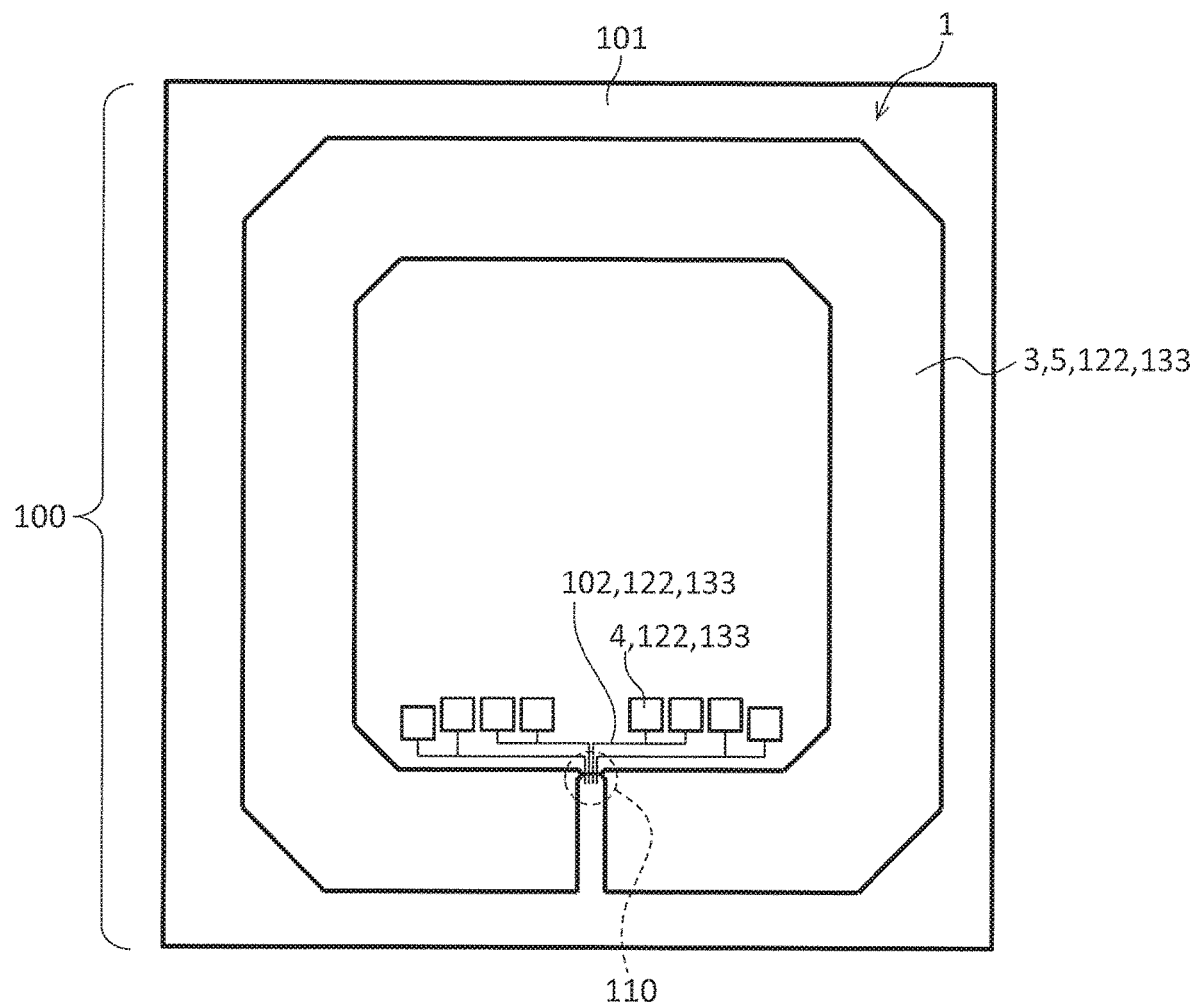
FIG. 6 is a diagram illustrating a plane view of a SQUID chip 100 used in this embodiment.
Figure 7:
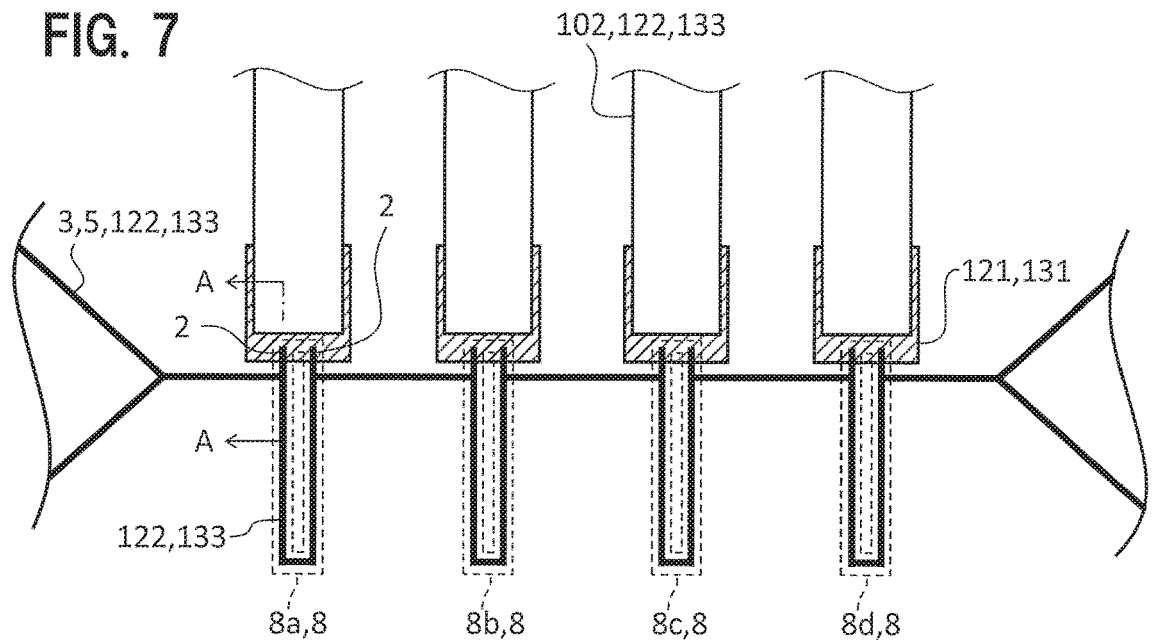
FIG. 7 is a magnified view of a portion denoted by reference numeral 110 in the SQUID chip 100 of FIG. 6.
Figure 8:
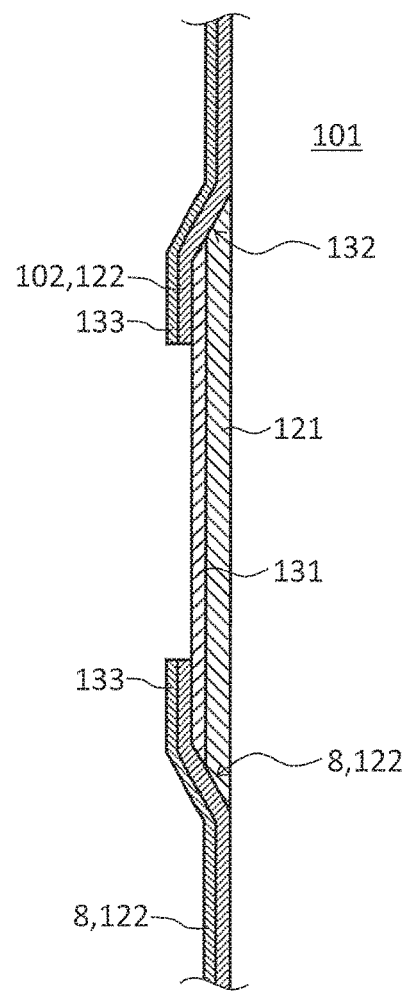
FIG. 8 is a schematic diagram of the A-A cross-section in FIG. 7.

FIG. 6 is a diagram illustrating a plane view of a SQUID chip 100 used in this embodiment. In addition, FIG. 7 is a magnified view of a portion denoted by reference numeral 110 in the SQUID chip 100 of FIG. 6, Then, FIG. 8 is a schematic diagram of the A-A cross-section in FIG. 7. Note that in FIGS. 6 to 8, the same components as of the above-described FIG. 31 have the same reference signs as of FIG. 31.

As shown in FIGS. 6 and 7, the SQUID magnetic sensor 1 has four SQUID inductors 8a to 8d (8), which are connected in series on a substrate 101, and a detection coil 3. Note that the SQUID inductors 8a to 8d (8) and the detection coil 3 belong to a second superconductive layer 122.

The SQUID chip 100 has an MgO single crystal substrate (substrate 101) with a thickness of 0.5 mm. Then, the SQUID magnetic sensor 1 is formed on the substrate 101. This SQUID magnetic sensor 1 is primarily formed of two kinds of superconductive layer. The two kinds of superconductive layer are a first superconductive layer 121 and the second superconductive layer 122.

For instance, a $SmBa_2Cu_3O_y$ (SmBCO) superconductive thin film with a film thickness of 250 nm is used for the first superconductive layer 121. Then, a $La_{0.1}$—$Er_{0.95}Ba_{1.95}Cu_3O_y$ (L1ErBCO) superconductive thin film with a film thickness of 250 nm is used for the second superconductive layer 122.

Note that in FIG. 7, the first superconductive layer 121 is denoted by slanted lines.

Here, how to manufacture the SQUID chip 100 is described with reference to FIGS. 7 and 8.

First, the first superconductive layer 121 is deposited on the entire surface of the substrate 101. Next, an $SrSnO_3$ thin film, which is an insulator with a film thickness of about 300 nm, is deposited, as an inter-layer insulating film 131, on the entire surface of the deposited first superconductive layer 121. The bilayer film of the first superconductive layer 121 and the inter-layer insulating film 131 are micro-processed to the shapes of slanted portions in FIG. 7. Here, as illustrated in FIG. 8, an edge portion 132 of the bilayer film processed is moderately inclined. Then, as shown in FIG. 8, regarding the edge portion 132, an end surface of the first superconductive layer 121, which is SmBCO and lies under the inter-layer insulating film 131, appears on a surface. The second superconductive layer 122 is deposited thereon. Further, an Au thin film 133 doubled as a surface protector is formed on the entire surface of the substrate 101, namely the first superconductive layer 121 and the second superconductive layer 122. After that, the second superconductive layer 122 and the Au thin film 133 are processed, by micromachining, into the shapes of the SQUID inductors 8a to 8d (8), the detection coil 3, terminals 4, and wiring 102.

As illustrated in FIG. 8, each edge portion of the SQUID inductors 8a to 8d is overlaid on the edge portion 132 of the first superconductive layer 121 and the inter-layer insulating film 131. Then, as shown in FIG. 8, the first superconductive layer 121 and the second superconductive layer 122 on the SQUID inductor 8 side are joined at the edge portion 132 to form a Josephson junction portion 2, This makes it possible to form the SQUID inductor 8 having a closed loop structure boxed by each dashed line in FIG. 7. That is, a current flowing through the SQUID inductor 8 flows in the second superconductive layer 122 and the first superconductive layer 121. Note that the Josephson junction formed on a inclined surface (ramp) of the edge portion 132 shown in FIG. 8 is called a ramp edge-type Josephson junction. In addition, as illustrated in FIGS. 7 and 8, the SQUID inductors 8a to 8d are connected, at predetermined sites, to the detection coil 3 (second superconductive layer 122).

The SQUID inductors 8a to 8d (8) and the detection coil 3 have a closed loop structure as described above in FIG. 31, Then, a supercurrent induced by a change in the outside magnetic field flows through the four SQUID inductors 8a to 8d, which are connected in series. The four SQUID inductors 8a to 8b can each be used to measure a magnetic flux. However, not all the four SQUID inductors 8a to 8d are used, Among the SQUID inductors 8a to 8d, a SQUID inductor(s) 8 with the optimal measurement characteristic may be used.

Figure 10:
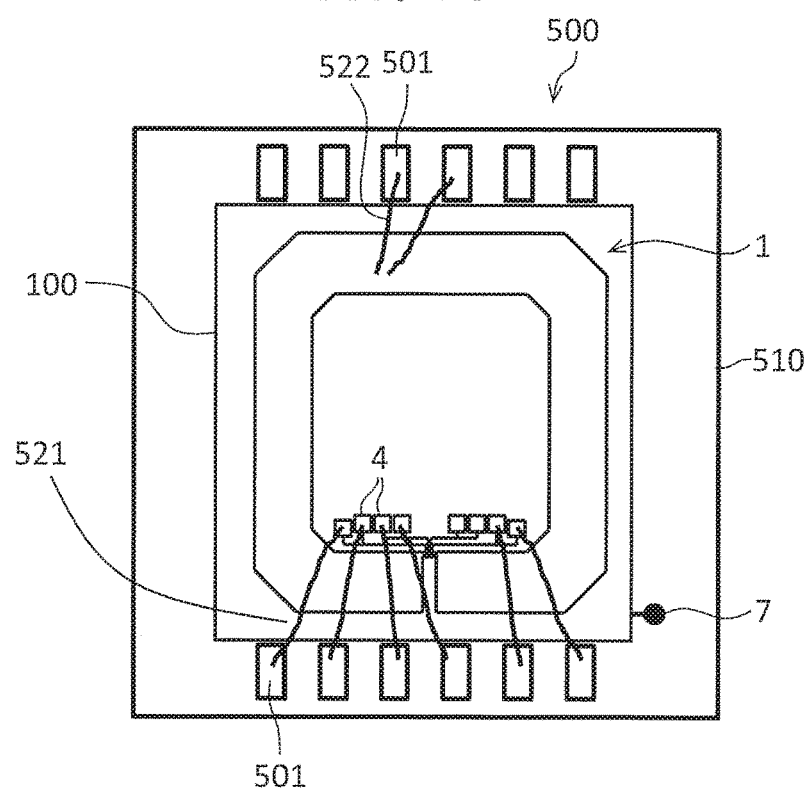
FIG. 10 is a diagram illustrating a state in which the SQUID chip 100 is mounted on the header substrate 500 shown in FIG. 9.

As described above, the second superconductive layer 122 is a bilayer film, the entire surface of which has the Au thin film 133 deposited and doubled as a surface protector. Accordingly, wiring can be connected, via the Au thin film 133, to the second superconductive layer 122 by wire bonding. For instance, the detection coil 3 of the second superconductive layer 122 is doubled as the terminals 5. As illustrated in FIG. 10, a bonding wire 522 can be connected via the Au thin film 133.

To measure a magnetic flux by using the high-temperature superconducting SQUID magnetic sensor 1, a bias current is made to flow between the terminals 5 and the terminals 4 connected to the SQUID inductor 8 used as described above. Then, the voltage therebetween is measured.

(Header Substrate 500)

Figure 9:
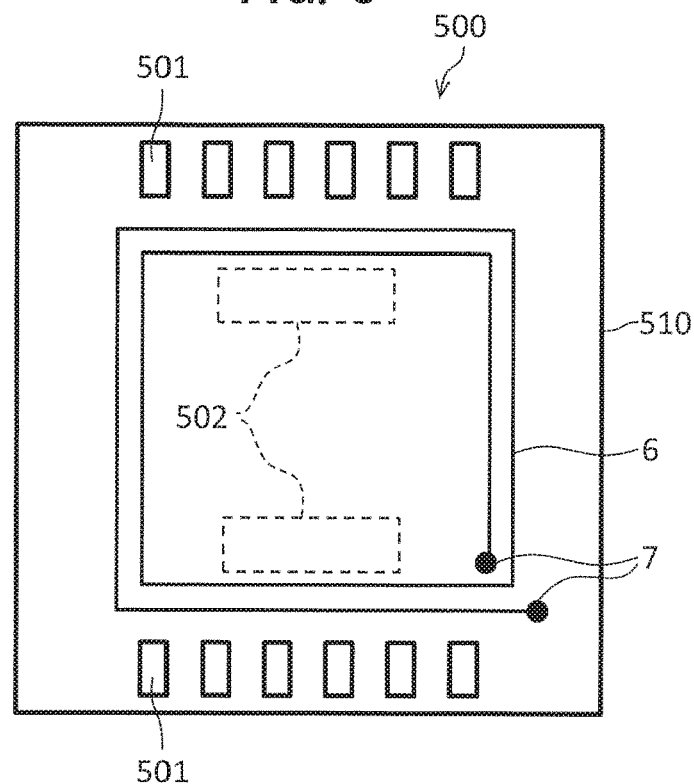
FIG. 9 is a diagram illustrating an example of a header substrate 500 used in this embodiment.

FIG. 9 is a diagram illustrating an example of a header substrate 500 used in this embodiment.

The SQUID chip 100 shown in FIG. 6 is mounted on the header substrate 500 shown in FIG. 9. The header substrate 500 has a copper wiring pattern (not shown) on both sides of a glass epoxy resin substrate 510. In addition, a double-wound feedback coil 6 is formed on a surface of the substrate 510. Further, wire bonding electrode pads 501 for connecting to the SQUID chip 100 is formed on the surface of the substrate 510. Furthermore, a back-surface of the substrate 510 has connectors 502 used to connect, via connectors 304 shown in FIGS. 11 to 14, to a converter base plate 305. Each wire bonding electrode pad 501 and the feedback coil 6 are connected to the connectors 502. Note that portions that connect the connectors 502, the respective wire bonding electrode pads 501, and the feedback coil 6 are not depicted in FIG. 9.

FIG. 10 is a diagram illustrating a state in which the SQUID chip 100 is mounted on the header substrate 500 shown in FIG. 9. Note that in the following drawings, the inter-layer insulating film 131 and the Au thin film 133 are not depicted.

In FIG. 10, the SQUID chip 100 is mounted on the header substrate 500, Then, the terminals 4 of the SQUID chip 100 are connected, using the bonding wires 521, to the wire bonding electrode pads 501. Further, the detection coil 3 and the wire bonding electrode pads 501 on the header substrate 500 are connected via the bonding wires 522.

Because the SQUID chip 100 is formed on, for instance, a substrate with a thickness of 0.5 mm, the feedback coil 6 on the header substrate 500 and the detection coil 3 of the SQUID chip 100 are apart by 0.5 mm.

Note that it is desirable to be used in a closed state in which an FRP (Fiber Reinforced Plastic) resin-made cap 351 covers the header substrate 500. Such a configuration can protect the bonding wires 521 and the SQUID chip 100 and prevent deterioration thereof due to condensation, etc.

(Probe 12A According to Comparative Example)

Figure 11:
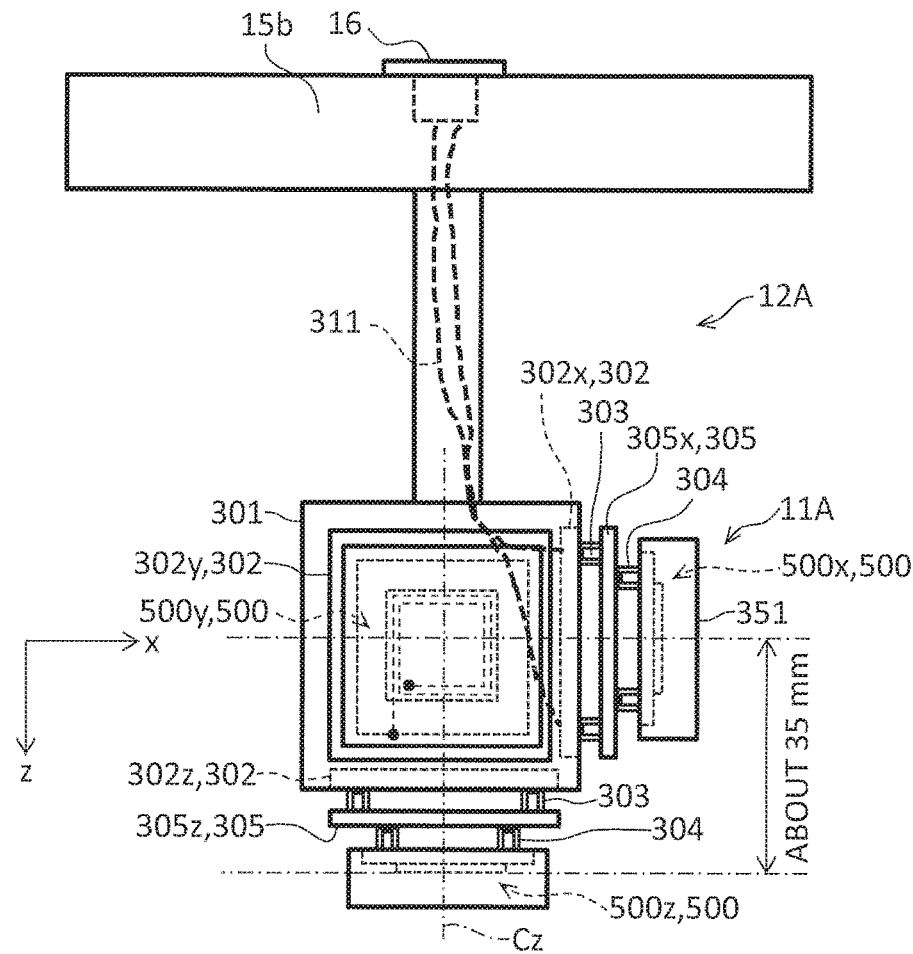
FIG. 11 is a diagram of a probe 12A under cubic arrangement as a comparative example when viewed in the y-axis direction.
Figure 12:
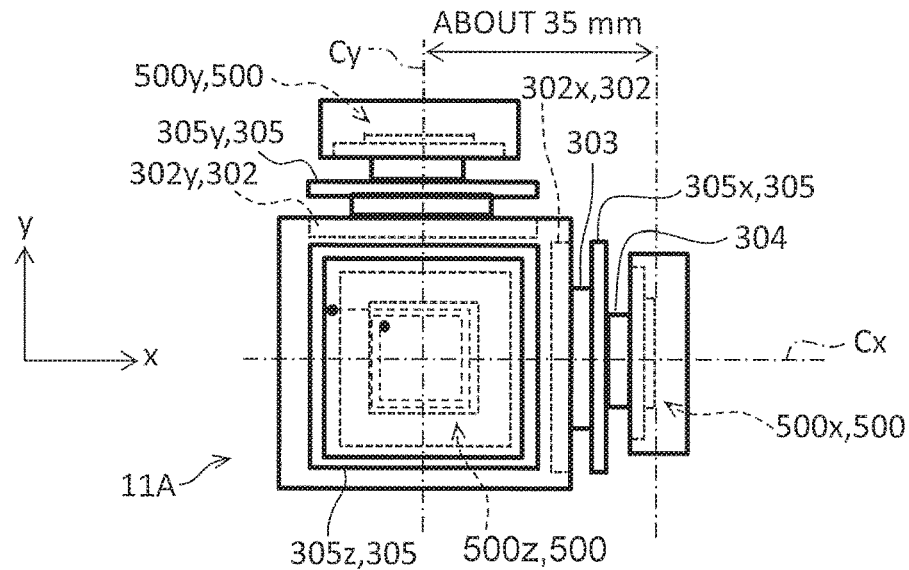
FIG. 12 is a diagram of the probe 12A under cubic arrangement as the comparative example when viewed in the z-axis direction.

FIGS. 11 and 12 are diagrams illustrating an example of a probe 12A under cubic arrangement as a comparative example. FIG. 11 is a diagram of the probe 12A when viewed in the y-axis direction. FIG. 12 is a diagram of the probe 12A when viewed in the z-axis direction.

For a probe head 11A of the probe 12A, three sides of an FRP-made cubic support body 301 are provided with receptacle boards 302x to 302z (302). Connectors 303 are attached to each receptacle board 302. The connectors 303 of each receptacle board 302 and the connectors 16 of the lid 15b are connected using, for instance, phosphor bronze-made wiring 311. This wiring 311 is connected to the FLL circuit 21 (see FIG. 5).

The converter base plates 305x to 305z (305) are mounted, via the connectors 303, on the respective receptacle boards 302. As described above, the back-surface of each of the converter base plates 305x to 305z has the connectors 303. In addition, the outside surface of each of the converter base plates 305x to 305z has the connectors 304.

Further, the wiring 311 is connected to each receptacle board 302. Thus, the wiring 311 is connected, via each receptacle board 302, to the connectors 303, the converter base plate 305, the connectors 304, and the SQUID magnetic sensor 1 on the header substrate 500. Here, although not depicted in FIGS. 11 and 12, the SQUID magnetic sensor 1x is mounted on the header substrate 500x. Likewise, the SQUID magnetic sensor 1y is mounted on the header substrate 500y and the SQUID magnetic sensor 1z is mounted on the header substrate 500z. Note that just wiring 311 connected to the SQUID magnetic sensor 1x is shown in FIG. 11 in order to make it easy to understand the drawings. However, the wiring 311 is likewise connected to the SQUID magnetic sensors 1y and 1z.

Note that as illustrated in FIGS. 6 and 7, the SQUID chip 100 is provided with the plurality of SQUID inductors 8. Any one of the SQUID inductors 8 is connected to the wiring 311.

Each header substrate 500 (500x to 500z) having the SQUID chip 100 mounted is installed to the connectors 304 of each of the converter base plates 305x to 305z. This configuration allows for cubic arrangement of the three SQUID magnetic sensors 1x to 1z mounted on the header substrates 500x to 500z, respectively. The respective SQUID magnetic sensors 1 are subject to the cubic arrangement, so that the central axes Cx to Cz of the three SQUID magnetic sensors 1x to intersect at the center of the support body 301. Note that the distance between the point of intersection among the respective central axes Cx to Cz and the center of the detection coil 3 of each SQUID magnetic sensor 1 is about 35 mm.

(Probe 12 According to This Embodiment)

Figure 13:
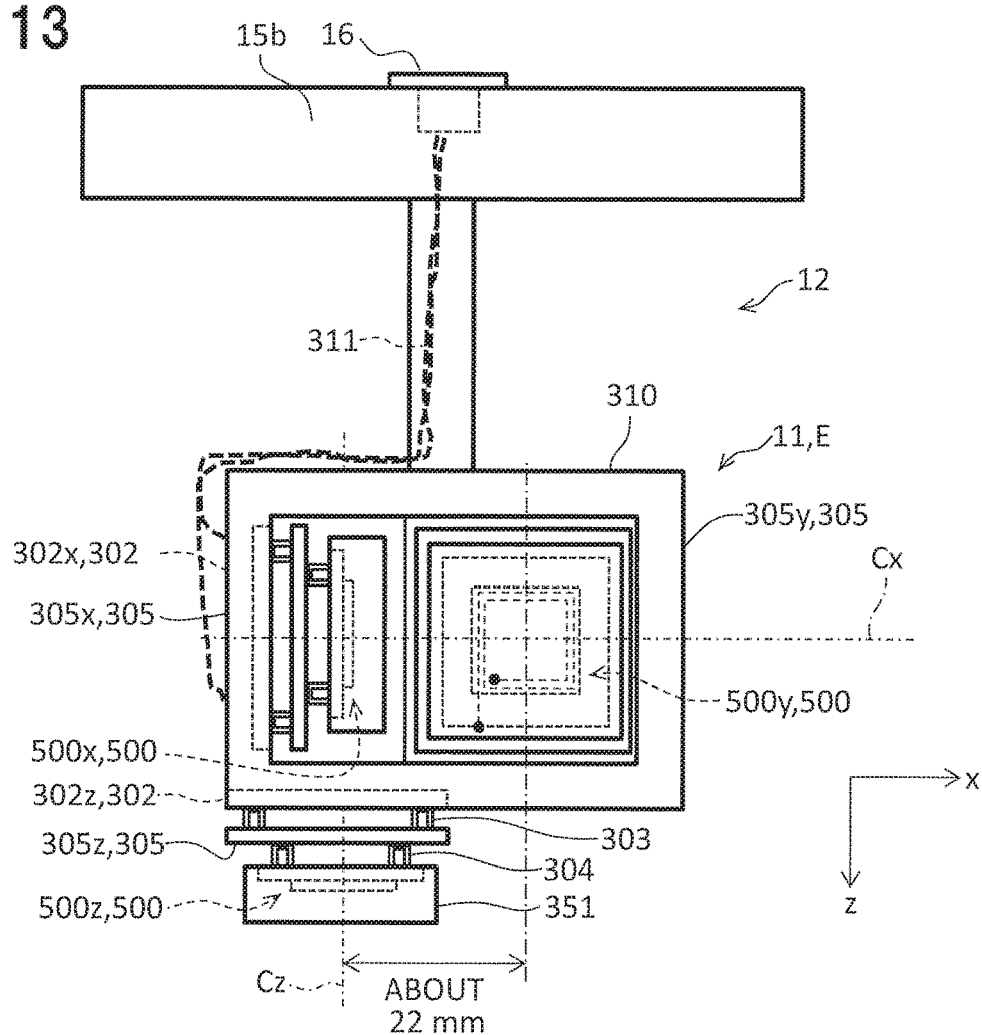
FIG. 13 is a diagram of a probe 12 (magnetic field measuring element E) used in an embodiment of the invention when viewed in the y-axis direction.
Figure 14:
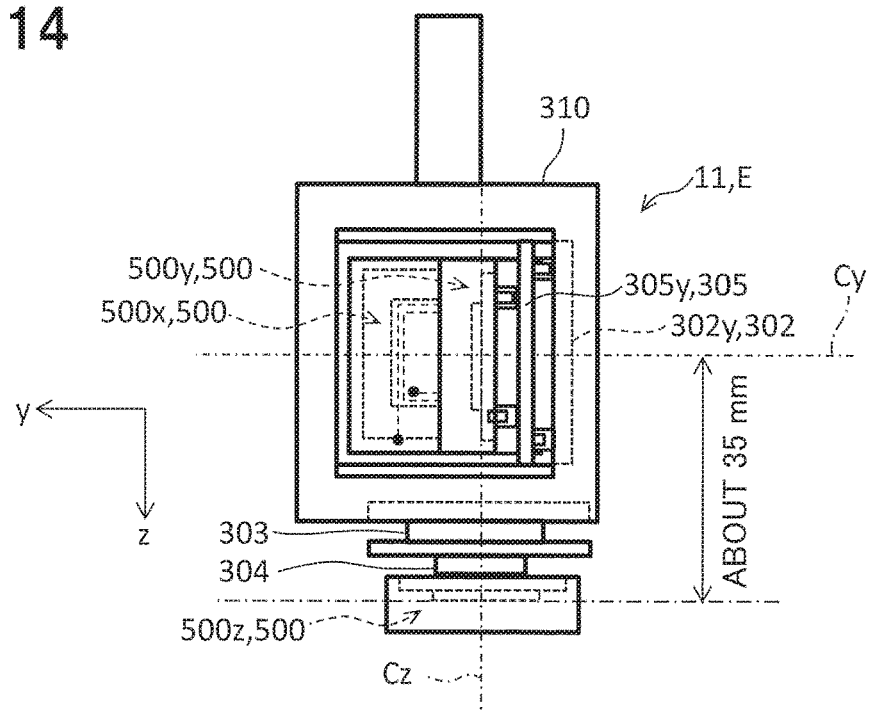
FIG. 14 is a diagram of the probe 12 (magnetic field measuring element E) used in this embodiment when viewed in the x-axis direction.

FIGS. 13 and 14 are diagrams of the probe 12 (magnetic field measuring element E) used in this embodiment. FIG. 13 is a diagram of the probe 12 when viewed in the y-axis direction. In addition, FIG. 14 is a diagram of the probe 12 when viewed in the x-axis direction. Note that in FIGS. 13 and 14, the same components as of FIGS. 11 and 12 have the same reference signs, and their description is omitted.

At the probe head 11 of the probe 12, two inner sides of an FRP-made hollow support body 310 are provided with the receptacle boards 302x and 302y. Then, the receptacle board 302z is placed on the bottom surface of the support body 310. The three header substrates 500x to 500z are mounted, via the connectors 304 and the converter base plates 305x to 305z, to the respective receptacle boards 302x to 302z.

Note that just wiring 311 connected to the SQUID magnetic sensor 1x is shown in FIGS. 13 and 14 in order to make it easy to understand the drawings. However, the wiring 311 is likewise connected to the SQUID magnetic sensors 1y and 1z.

Meanwhile, as illustrated in FIGS. 6 and 7, the SQUID chip 100 is provided with the plurality of SQUID inductors 8. Any one of the SQUID inductors 8 is connected to the wiring 311.

Here, it is designed such that the central axis Cx of the SQUID magnetic sensor 1x and the central axis Cz of the SQUID magnetic sensor 1z intersect between the detection coil 3 and the feedback coil 6 of the SQUID magnetic sensor 1x. Specifically, the central axis Cx and the central axis Cz intersect between the SQUID chip 100 and the substrate 510 of the header substrate 500x (see FIG. 10).

Note that as illustrated in FIG. 14, the distance between the center of the detection coil 3 of the SQUID magnetic sensor 1x and the center of the detection coil 3 of the SQUID magnetic sensor 1z is about 35 mm.

Further, in the illustration of FIG. 14, the central axis Cy of the SQUID magnetic sensor 1y and the central axis Cz of the SQUID magnetic sensor 1z intersect between the detection coil 3 and the feedback coil 6 of the SQUID magnetic sensor 1y; that is, the central axis Cy and the central axis Cz intersect between the SQUID chip 100 and the substrate 510 of the header substrate 500y (see FIG. 10). In the illustration of FIG. 13, the distance between the center of the detection coil 3 of the SQUID magnetic sensor 1z and the center of the detection coil 3 of the SQUID magnetic sensor 1y is about 22 mm.

As such, when the magnetic field measuring element E is actually manufactured, it is difficult due to the technical restriction during mounting to precisely position the SQUID magnetic sensor 1x on a plane perpendicular to the coil surface of the SQUID magnetic sensor 1z. The same applies to the SQUID magnetic sensors 1y and 1z.

In addition, it is also difficult to precisely position the center of the SQUID magnetic sensor 1x on the central axis Cz. The same applies to the SQUID magnetic sensor 1y. Further, when the detection coil 3 and the feedback coil 6 are formed on separate substrates as illustrated in FIG. 6, the detection coil 3 and the feedback coil 6 are apart by the substrate thickness.

As such, in the actual magnetic field measuring element E, the positional relation between the respective SQUID magnetic sensors 1x to 1z is somewhat different from ideal parallel relation or symmetric relation. This actually causes feedback magnetic field interference. However, as the positional relation between the respective SQUID magnetic sensors 1x to 1z is made closer to parallel relation or symmetric relation between their positions, the degree of interference becomes smaller than if not so. This matter will be described below.

(Measured Results)

Figure 15:
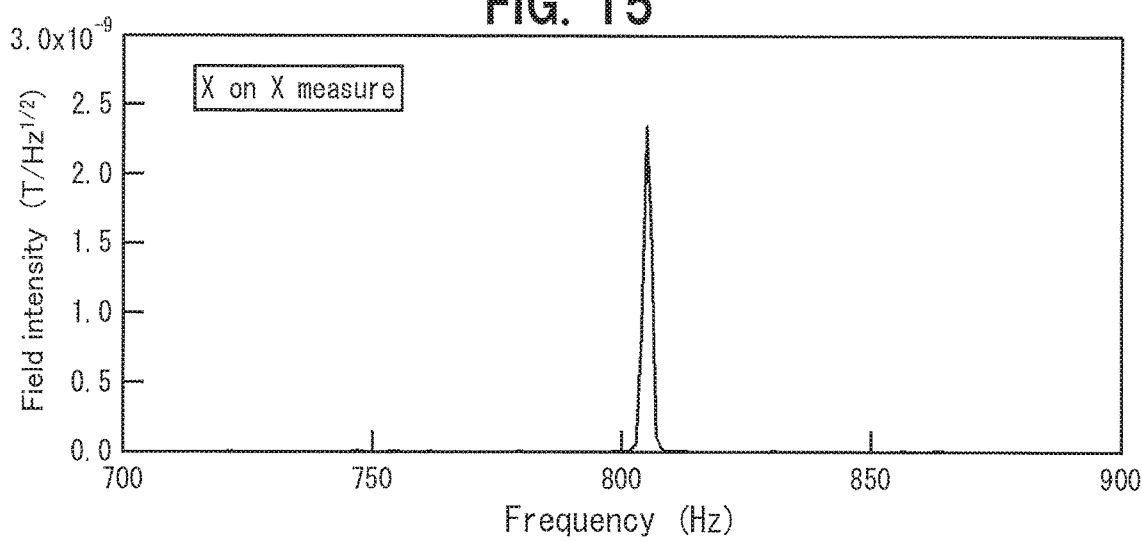
FIG. 15 is a chart showing the intensity of each magnetic signal in the magnetic field measuring element E of FIGS. 13 and 14 (the feedback coil 6 of the SQUID magnetic sensor 1x→the SQUID magnetic sensor 1x).
Figure 16:
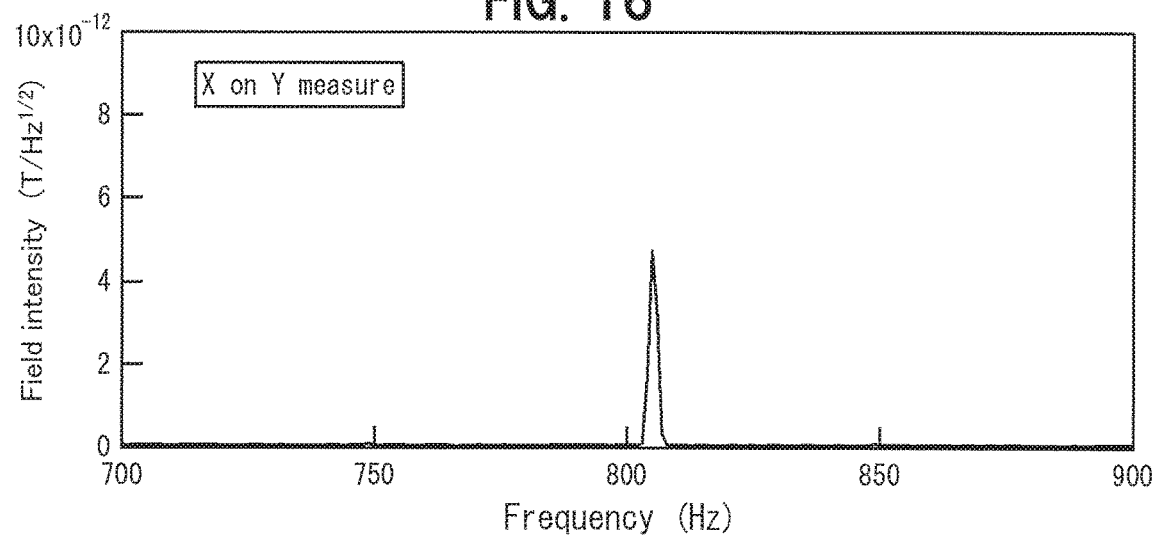
FIG. 16 is a chart showing the intensity of each magnetic signal in the magnetic field measuring element E of FIGS. 13 and 14 (the feedback coil 6 of the SQUID magnetic sensor 1x→the SQUID magnetic sensor 1y).
Figure 17:
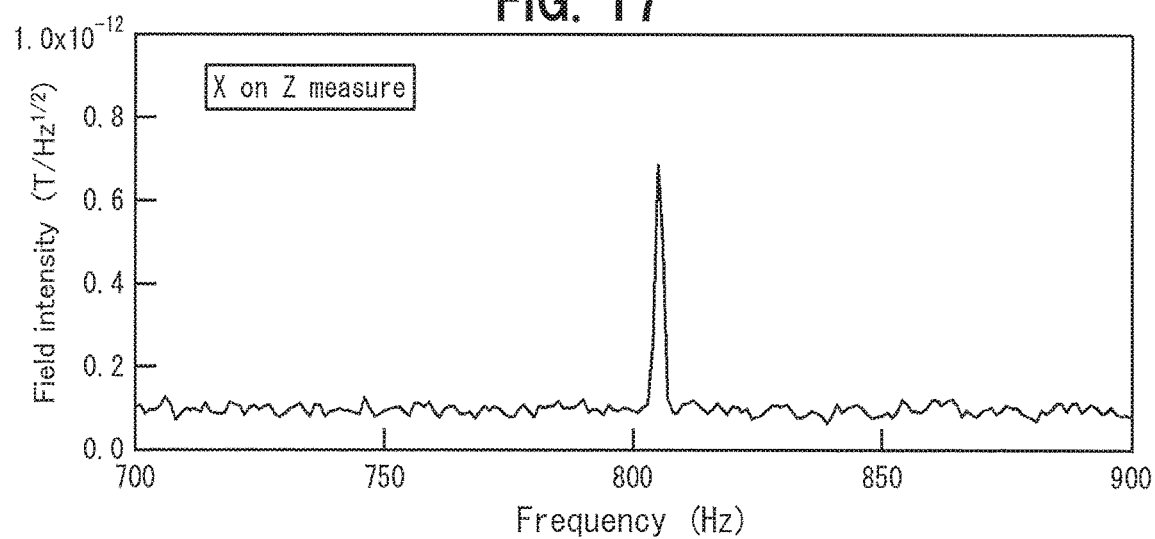
FIG. 17 is a chart showing the intensity of each magnetic signal in the magnetic field measuring element E of FIGS. 13 and 14 (the feedback coil 6 of the SQUID magnetic sensor 1x→the SQUID magnetic sensor 1z).

FIGS. 15 to 17 show the results of measuring, using a spectrum analyzer (not shown), the interference with each SQUID magnetic sensor 1 while a sine-wave current is made to flow through the feedback coil 6 of the SQUID magnetic sensor 1 in the probe 12 illustrated in FIGS. 13 and 14.

The interference between the feedback coil 6 and the other SQUID magnetic sensors 1 was evaluated as follows.

The SQUID magnetic sensors 1 used in FIGS. 15 to 17 are arranged like the SQUID magnetic sensors 1 shown in FIGS. 13 and 14.

FIGS. 15 to 17 show the results of evaluating the interference between the feedback coil 6 of the SQUID magnetic sensor 1$x$ and each of the SQUID magnetic sensors 1$x$ to 1$z$. Here, a sine-wave current with a frequency of about 800 Hz and an amplitude of about 50 µA was made to flow though the feedback coil 6 of the SQUID magnetic sensor 1$x$. Next, the SQUID magnetic sensor 1$x$ was subjected to feedback control. Then, FIG. 15 shows the results of measuring, in the SQUID magnetic sensor 1$x$ itself, a magnetic flux caused by the magnetic field induced by the feedback coil 6 of the SQUID magnetic sensor 1$x$. In FIG. 15, an output signal frequency spectrum was measured, and the intensity of peak present at the frequency of the current made to flow through the feedback coil 6 was set to a reference magnetic signal intensity. As a result, FIG. 15 demonstrates that a sharp peak at 805 Hz appeared and the corresponding magnetic flux was 2.35×10$^{-9}$ T/Hz$^{1/2}$ in terms of magnetic field.

Next, under the same conditions, the feedback control of the SQUID magnetic sensor 1$x$ was turned off from the state in which the current is made to flow through the feedback coil 6 of the SQUID magnetic sensor 1$x$. This is because feedback control of the SQUID magnetic sensor 1$x$ causes a feedback current to flow so as to cancel the current made to flow through the feedback coil 6.

Then, magnetic signals in the SQUID magnetic sensors 1$y$ and 1$z$ from the feedback coil 6 of the SQUID magnetic sensor 1$x$ were measured under a state in which the feedback control of the SQUID magnetic sensor 1$x$ was off. Each magnetic signal intensity was the intensity of each peak in a frequency spectrum like in FIG. 15.

FIG. 16 shows a frequency spectrum measured in the SQUID magnetic sensor 1$y$. FIG. 17 shows a frequency spectrum measured in the SQUID magnetic sensor 1$z$. Shape peaks having a magnetic signal intensity of 4.74×10$^{-12}$ T/Hz$^{1/2}$ (see FIG. 16) or 6.83×10$^{-13}$ T/Hz$^{1/2}$ (see FIG. 17) were obtained.

The strength of interference was defined as a ratio (magnetic signal intensity ratio) between the magnetic signal intensity detected in the SQUID magnetic sensor 1$y$ or 1$z$ and the magnetic signal intensity detected in the SQUID magnetic sensor 1$x$ having the feedback coil 6 through which the current was made to flow. For instance, the strength (ratio) of interference in the SQUID magnetic sensor 1$y$ as caused by the feedback coil 6 of the SQUID magnetic sensor 1$x$ was calculated, form FIGS. 15 and 16, as 4.74×10$^{-12}$ (T/Hz$^{1/2}$)/2.35×10$^{-9}$≈2.01×10$^{-3}$≈1/496.

Measurements were likewise repeated when a sine-wave current was made to flow through the feedback coil 6 of the SQUID magnetic sensor 1$y$ and when a sine-wave current was made to flow through the feedback coil 6 of the SQUID magnetic sensor 1$z$.

Specifically, the sine-wave current with a frequency of about 800 Hz and an amplitude of about 50 µA was made to flow though the feedback coil 6 of the SQUID magnetic sensor 1$y$. Next, the SQUID magnetic sensor 1$y$ was subjected to feedback control. Then, a magnetic flux caused by the magnetic field induced by the feedback coil 6 of the SQUID magnetic sensor 1$y$ was measured in the SQUID magnetic sensor 1$y$ itself.

Next, under the same conditions, the feedback control of the SQUID magnetic sensor 1$y$ was turned off from the state in which the current is made to flow through the feedback coil 6 of the SQUID magnetic sensor 1$y$. Under the state, magnetic fluxes in the SQUID magnetic sensors 1$z$ and 1$x$ as induced by the feedback coil 6 of the SQUID magnetic sensor 1$y$ were measured.

Then, the strength of interference was set to a ratio between the magnetic signal intensity calculated from the magnetic flux measured in the SQUID magnetic sensor 1$z$ or 1$x$ and the magnetic flux measured in the SQUID magnetic sensor 1$y$ itself.

Under the same conditions, the strength of interference was set to a ratio between the magnetic signal intensity calculated from the magnetic flux measured in the SQUID magnetic sensor 1$x$ or 1$y$ and the magnetic signal intensity calculated from the magnetic flux measured in the SQUID magnetic sensor 1$z$ itself.

FIG. 18 is a table showing the strength of interference with each SQUID magnetic sensor 1 under the arrangement in the comparative example. FIG. 19 is a table showing the strength of interference with each SQUID magnetic sensor 1 under the arrangement used in this embodiment.

Here, the comparative example in FIG. 18 refers to the arrangement of the SQUID magnetic sensors 1 as shown in FIGS. 11 and 12, Then, the arrangement used in this embodiment in FIG. 19 refers to the arrangement shown in FIGS. 13 and 14.

Each row of the table in FIG. 18 or FIG. 19 indicates an SQUID magnetic sensor 1 detected. Then, each column indicates a feedback coil 6 through which the current was made to flow.

For instance, column 601 in FIG. 18 or column 611 in FIG. 19 indicate the results (magnetic signal intensity ratios) obtained by measuring magnetic fluxes in the SQUID magnetic sensors 1$x$ to 1$z$ after the current was made to flow through the feedback coil 6 of the SQUID magnetic sensor 1$x$.

Likewise, column 602 in FIG. 18 or column 612 in FIG. 19 indicate the results (magnetic signal intensity ratios) obtained by measuring magnetic fluxes in the SQUID magnetic sensors 1$x$ to 1$z$ after the current was made to flow through the feedback coil 6 of the SQUID magnetic sensor 1$y$.

Then, column 603 in FIG. 18 or column 613 in FIG. 19 indicate the results (magnetic signal intensity ratios) obtained by measuring magnetic fluxes in the SQUID magnetic sensors 1$x$ to 1$z$ after the current was made to flow through the feedback coil 6 of the SQUID magnetic sensor 1$z$.

The number of combinations between the SQUID magnetic sensor 1 detected and the feedback coil 6 through which the current was made to flow is 9. In this regard, according to the above interference strength definitions, the strength of interference with the SQUID magnetic sensor 1 itself through which the current was made to flow is 1. Because of this, it is appropriate to compare six combinations obtained by excluding the strength of interference with the SQUID magnetic sensor 1 itself through which the current was made to flow.

In the case of the probe head 11A under cubic arrangement, as shown in FIG. 18, 4 out of 6 combinations had interference larger than 1/1000. By contrast, in the case of the probe head 11 to which the arrangement shown in this embodiment was applied, only 1 of 6 combinations had interference equal to or larger than 1/1000 as shown in FIG. 19 (the interference with the SQUID magnetic sensor 1$y$ as caused by the feedback coil 6 of the SQUID magnetic sensor 1$x$). The column denoted by the reference numeral 613, in particular, has markedly improved effects.

In the probe head 11A under cubic arrangement as shown in FIGS. 11 and 12, the spacing between the SQUID magnetic sensor 1x and the SQUID magnetic sensor 1y is 35 mm. By contrast, in the case of the probe head 11 to which the arrangement in this embodiment was applied, the spacing between the SQUID magnetic sensor 1x and the SQUID magnetic sensor 1y is 22 mm and shorter as shown in FIG. 13. This case seems to be unpreferable because as the distance between the SQUID magnetic sensors 1 becomes shorter, the interference increases. Note that the distances to the SQUID magnetic sensor 1z are 35 mm in either the probe 12A in the comparative example or the probe 12 in this embodiment.

As such, according to the magnetic field measuring element E (Ea) under the arrangement in this embodiment, it is possible to improve the interference caused by the feedback in response to the magnetic field in the z direction, which magnetic field is the strongest among those in the three directions.

Fourth Embodiment

Figure 20:
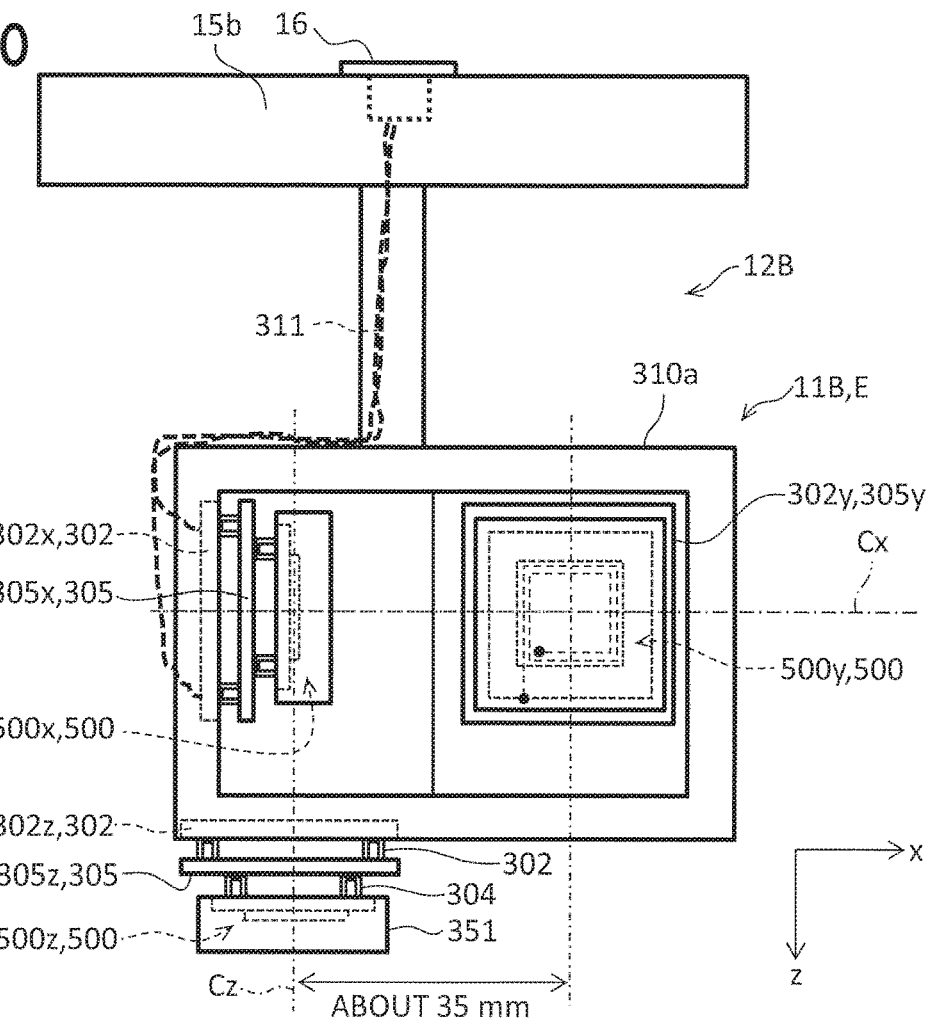
FIG. 20 is a diagram of a probe 12B (magnetic field measuring element E) used in a fourth embodiment when viewed in the y-axis direction.
Figure 21:
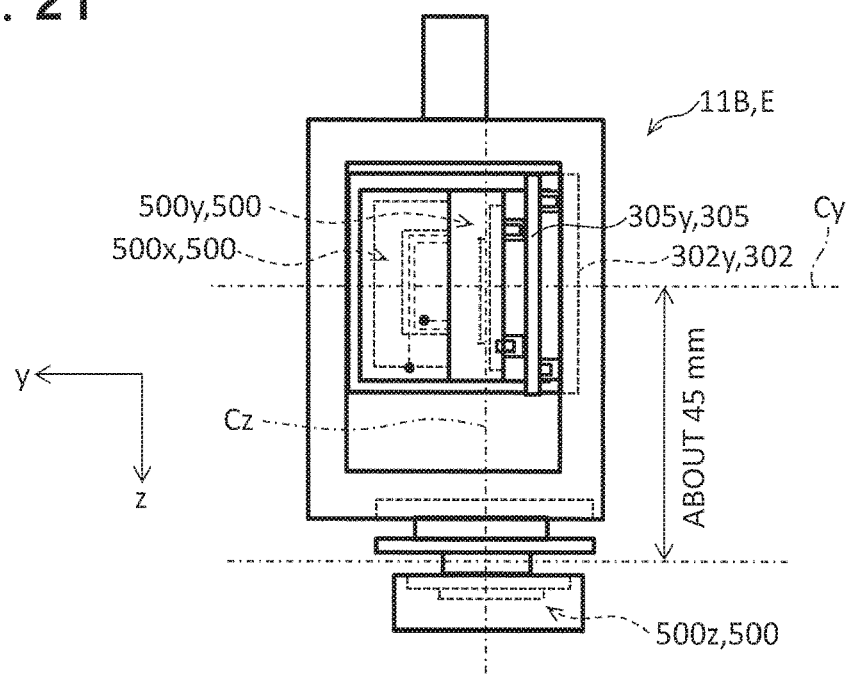
FIG. 21 is a diagram of the probe 12B (magnetic field measuring element E) used in the fourth embodiment when viewed in the x-axis direction.

FIGS. 20 and 21 are diagrams of a probe 12B (magnetic field measuring element E) used in a fourth embodiment. FIG. 20 is a diagram of the probe 12B when viewed in the y-axis direction. In addition, FIG. 21 is a diagram of the probe 12B when viewed in the x-axis direction. In FIGS. 20 and 21, the same components as of FIGS. 11 to 14 have the same reference signs, and their description is omitted.

In the probe 12B, in order to improve the interference between the SQUID magnetic sensor 1x and the SQUID magnetic sensor 1y as indicated in the table of FIG. 19, the spacing between the SQUID magnetic sensor 1x and the SQUID magnetic sensor 1y is extended to about 35 mm, which is the same as in the case of the probe 12A (comparative example).

Further, in a support body 310a as a component of a probe head 11B of the probe 12B, the spacing between the SQUID magnetic sensor 1z and the SQUID magnetic sensor 1x or 1y is extended to about 45 mm.

As described previously, in the TEM measurement, the strength of the magnetic field in the z direction is several to several dozen times greater than the strength in the x or y direction. Accordingly, a large current seems to flow through, in particular, the feedback coil 6 of the SQUID magnetic sensor 1z. In view of this, the interference should be improved by enlarging the spacing between the SQUID magnetic sensor 1z and the SQUID magnetic sensor 1x or 1y.

Then, the strength of interference was measured, using the probe 12B shown in FIGS. 20 and 21, by the same method as the method indicated in FIGS. 15 to 19.

Figures 22, 23:
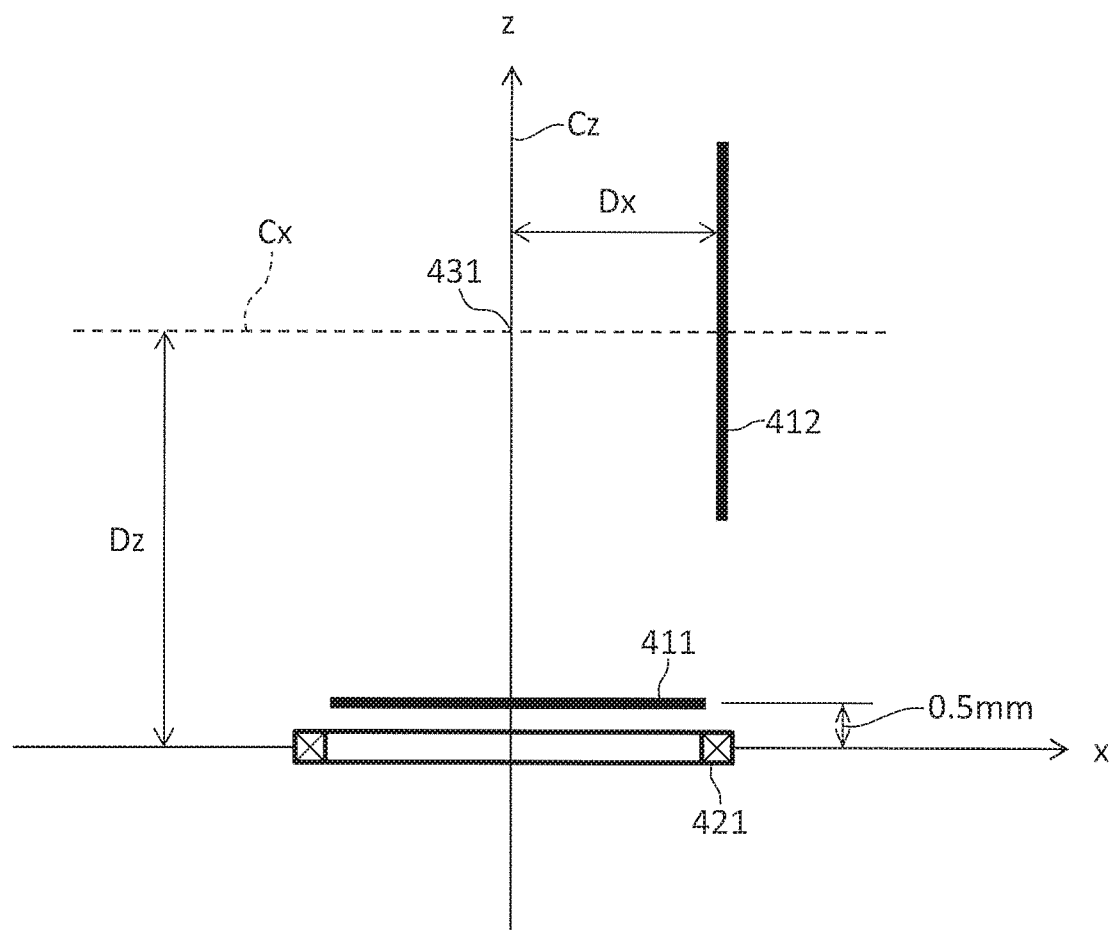
FIG. 22 is a table showing the strength of interference with each SQUID magnetic sensor 1 under the arrangement in FIGS. 20 and 21.
FIG. 23 is a diagram illustrating a model for SQUID magnetic sensors 1 used in a numerical simulation of parallel relation.

FIG. 22 shows the measured results.

The content designated by the table shown in FIG. 22 is substantially the same as in FIGS. 18 and 19.

In the probe 12B, the interval between the SQUID magnetic sensor 1x and the SQUID magnetic sensor 1y is set under the arrangement of the SQUID magnetic sensors 1 shown in FIG. 20 and they are apart by the same distance as in the cubic-type probe 12A. This configuration demonstrated marked improvement in the interference with the SQUID magnetic sensors 1x and 1y. In addition, the interference between the SQUID magnetic sensor 1z and the SQUID magnetic sensor 1x or 1y was also improved, indicating that the degree of interference in almost all the combinations was equal to or less than 1/2000.

Note that in FIG. 4, the SQUID magnetic sensors 1 are arranged such that the distances between the SQUID magnetic sensors 1 are made equal. Such arrangement can elongate the distances between the SQUID magnetic sensors 1 without markedly changing the size of the magnetic field measuring element Ea itself.

Simulation (Parallel Relation)

Next, effects of the arrangement of the SQUID magnetic sensors 1 in this embodiment will be demonstrated by numerical simulation.

FIG. 23 is a diagram illustrating a model for SQUID magnetic sensors 1 used in the numerical simulation of parallel relation.

In this model, the positional relation between the two SQUID magnetic sensors 1 corresponds to the case of parallel relation. First, a feedback coil model 421, which corresponds to the feedback coil 6 of the SQUID magnetic sensor 1z, was set in a computer (not shown) used for the simulation. This feedback coil model 421 is a square coil having a side with an outer diameter of 14 mm. In addition, the thickness of this feedback coil model 421 is 0.2 mm and the inner diameter of a side is 13 mm.

The computer calculated the distribution of the magnetic flux induced when a DC current was made to flow through this feedback coil model 421. Further, a square z-direction detection plane model 411 having a side of 13 mm was disposed at a position that was directly over the feedback coil model 421 and was apart by 0.5 mm from the feedback coil model 421. The detection plane model 411 represents a plane of the detection coil 3 of the SQUID magnetic sensor 1z.

Then, the computer calculated the strength Bz of the magnetic field in the z-direction from the magnetic flux interlinked with the detection plane model 411 when a current was made to flow through the feedback coil model 421.

Furthermore, a detection plane model 412 is set such that the model is apart by the distance Dz in the z direction from the center of the feedback coil model 421 and the central axis Cx passes through the center. The detection plane model 412 represents the coil surface of the detection coil 3 of the SQUID magnetic sensor 1x. In this regard, however, the left and right in the relation indicated by FIG. 13 or 20 is inverted. The detection plane model 412 has a square shape with a side of 13 mm.

Subsequently, 3 simulations were carried out while the Dz value was either 9 mm, 22 mm, or 35 mm. In addition, the point of intersection between the central axis Cx of the detection plane model 412 and the central axis Cz of the feedback coil model 421 is set to an intersection point 431. Next, the computer set, to Dx, the distance between the intersection point 431 and the center of the detection plane model 412 and horizontally moved the detection plane model 412 while the Dx was changed from 0 to 40 mm. Then, the computer calculated the feedback coil model 421-derived magnetic flux interlinked with the detection plane model 412 at each Dx. After that, the computer calculated, based on this magnetic flux, the strength. Bx of the magnetic field interlinked with the detection plane model 412. This strength Bx of the magnetic field represents the interference with the detection coil 3 of the SQUID magnetic sensor 1x as caused by the feedback coil 6 of the SQUID magnetic sensor 1z. Finally, the normalized Bx/Bz described in FIGS. 18 and 19 was used to calculate Dx dependency of the interference.

Figure 24:
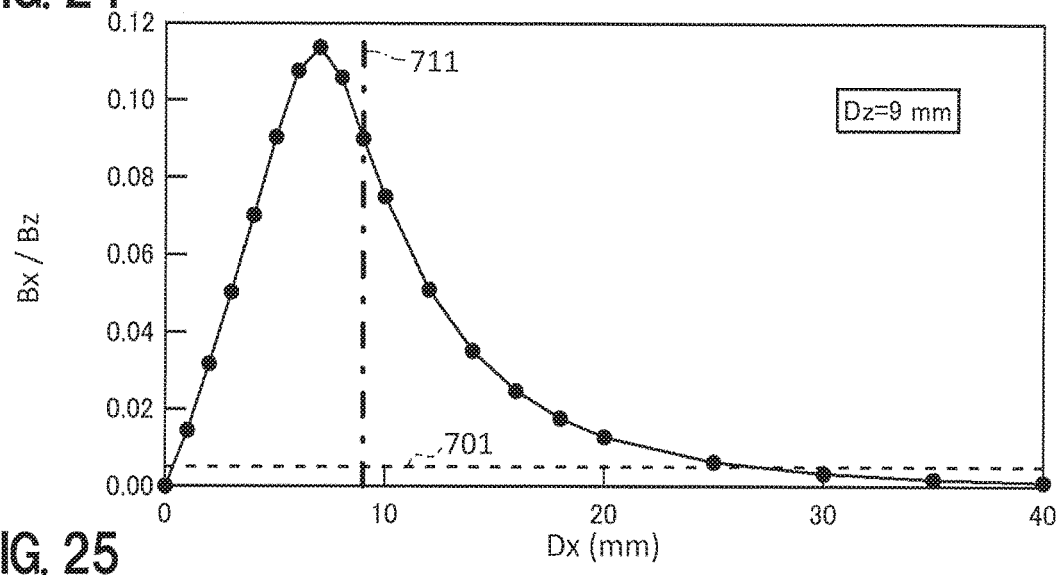
FIG. 24 is a graph (Dz=9 mm) showing Dx dependency with respect to the Bx/Bz as simulated under conditions illustrated in FIG. 23.
Figure 25:
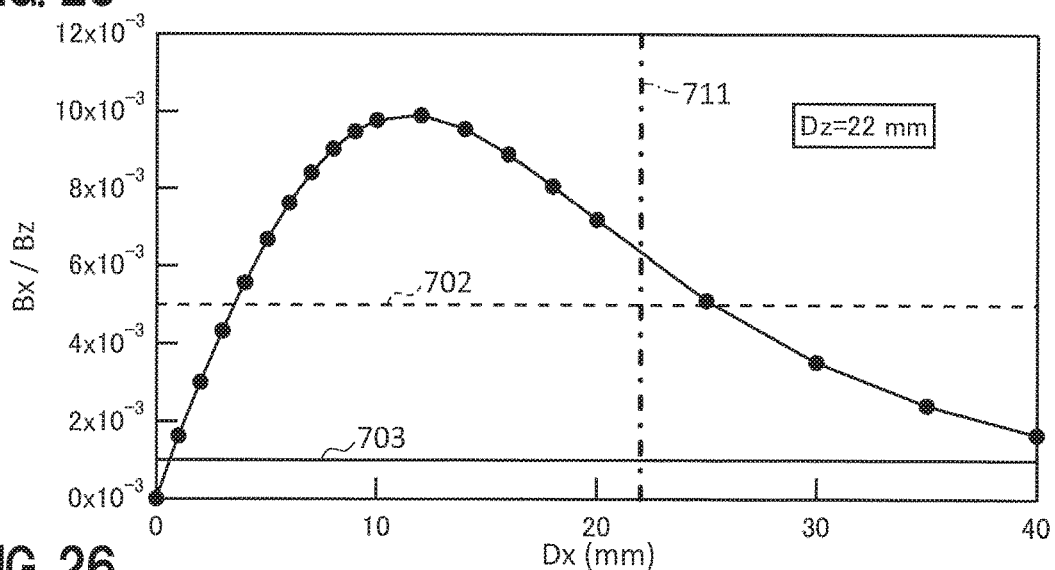
FIG. 25 is a graph (Dz=22 mm) showing Dx dependency with respect to the Bx/Bz as simulated under conditions illustrated in FIG. 23.
Figure 26:
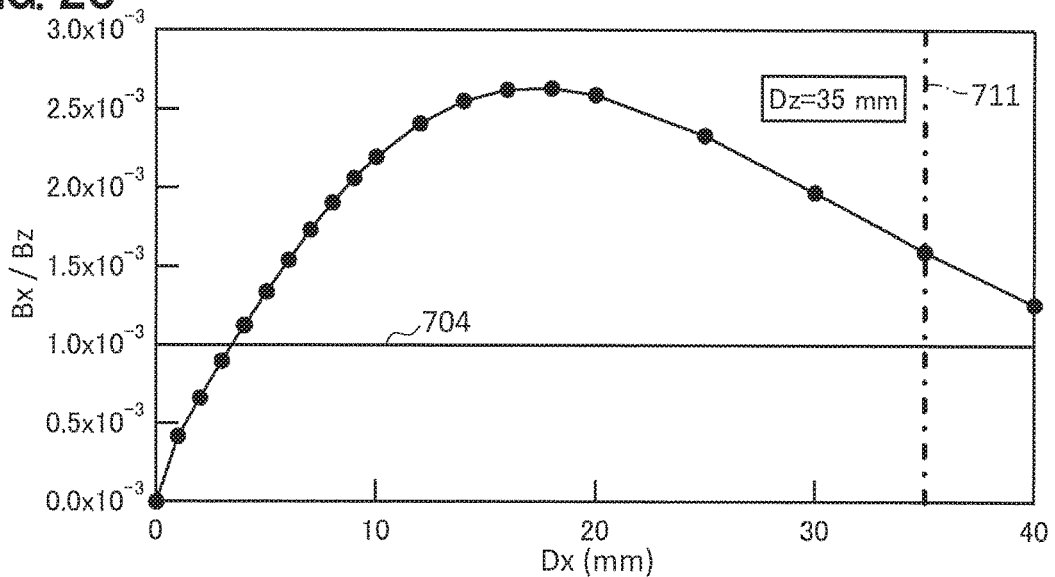
FIG. 26 is a graph (Dz=35 mm) showing Dx dependency with respect to the Bx/Bz as simulated under conditions illustrated in FIG. 23.

FIGS. 24 to 26 are graphs showing Dx dependency with respect to the Bx/Bz as simulated under conditions illustrated in FIG. 23.

FIG. 24 shows the case of Dz=9 mm, FIG. 25 shows the case of Dz=22 mm, and FIG. 26 shows the case of Dz=35 mm. The vertical dashed-dotted lines 711 shown in the graphs of FIGS. 24 to 26 indicate Dx that is equal to Dz. That is, the point of intersection between the dashed-dotted line 711 and the graph corresponds to the interference between the SQUID magnetic sensors 1 under cubic arrangement.

In any of FIGS. 24 to 26, the Bx/Bz value is 0 in the case of Dx=0 where the detection plane model 412 is positioned on the central axis Cz of the feedback coil model 421. Meanwhile, in any of FIGS. 24 to 26, there was a tendency that as Dx was deviated from 0, Bx/Bz once increased rapidly, reached the maximum at a given Dx, and then decreased gradually.

Here, the dashed line 701 in FIG. 24 and the dashed line 702 in FIG. 25 indicate that Bx/Bz=1/200. Then, the solid line 703 in FIG. 25 and the solid line 704 in FIG. 26 indicate that Bx/Bz=1/1000.

When Dz is small like Dz=9 mm (FIG. 24), that is, the distance between the SQUID magnetic sensor 1z and the SQUID magnetic sensor 1x is short, the Bx/Bz value is generally large. That Bx/Bz≤1/200 (dashed line 701) is met when Dx is within a small region in the vicinity of 0. In this regard, when Dx≥27 mm in FIG. 24, Bx/Bz≤1/200 (dashed line 701) is met. However, this Dx causes the compactness to be impaired because the Dx is larger than in the case (dashed-dotted line 711) of the SQUID magnetic sensors 1 under cubic arrangement.

As Dz increases to Dz=22 mm (FIG. 25) to Dz=35 mm (FIG. 26), the Bx/Bz value decreases generally. As a result, in the case of Dz=22 mm (FIG. 25), a region where Bx/Bz≤1/200 (dashed line 702) lies in a region where Dx≤3 mm. This makes the region where Bx/Bz≤1/200 broader than the Dx region where Bx/Bz≤1/200 (dashed line 701) in FIG. 24.

Here, in the case of Dz=22 mm (FIG. 25), that Bx/Bz≤1/1000 (solid line 703) is met in the Dx region of Dx≤1 mm or Dx>40 mm. Note that that Dx>40 mm causes the compactness to be impaired because the Dx is larger than in the case (dashed-dotted line 711) of the SQUID magnetic sensors 1 under cubic arrangement, and is excluded from consideration.

Then, in the case of Dz=35 mm (FIG. 26), a region where Bx/Bz≤1/1000 (solid line 704) lies in a region where Dx≤3 mm. This region is broader than the region where Bx/Bz≤1/1000 (solid line 703), that is, Dx<1 mm as shown in FIG. 25.

It may be difficult to likewise arrange the SQUID magnetic sensors 1z and 1x to be perfectly perpendicular to each other. That is, it may be difficult in terms of technical and cost performance to dispose the SQUID magnetic sensor 1x perfectly on the central axis Cz. In such a case, extending the distance between the SQUID magnetic sensors 1 makes it possible to extend a region where the interference is small. This is because extending the distance between the SQUID magnetic sensors 1 weakens the magnetic field that reaches the other SQUID magnetic sensor(s) 1 from a certain SQUID magnetic sensor 1. This can also enlarge a margin for positioning the SQUID magnetic sensors 1. Specifically, the degree of freedom in arranging the SQUID magnetic sensors 1 is increased. For instance, when the interference of 1/1000 or less is required and the positioning of Dx=0.5 mm or smaller is possible, Dz may be about 22 mm as shown in FIG. 25. In addition, when the precise positioning of Dx=from 2 to 3 mm is just possible, the interference of 1/1000 or less can be achieved by setting the Dz to about 35 mm as shown in FIG. 26.

As shown in FIGS. 24 to 26, extending the distance between the SQUID magnetic sensors 1 makes it possible to decrease the interference therebetween.

As described above, the vertical dashed-dotted lines 711 shown in the graphs of FIGS. 24 to 26 indicate Dx that is equal to Dz. That is, as described above, the point of intersection between the dashed-dotted line 711 and the graph corresponds to the interference between the SQUID magnetic sensors 1 under cubic arrangement. FIGS. 24 to 26 demonstrate that the interference between the SQUID magnetic sensors 1 in parallel relation is smaller than the interference between the SQUID magnetic sensors 1 under cubic arrangement with the same distance as of the former.
(Symmetric Relation)

The following shows the results of numerical simulation when the positional relation between the detection coil 3 and the feedback coil 6 is symmetric relation.

Figure 27:
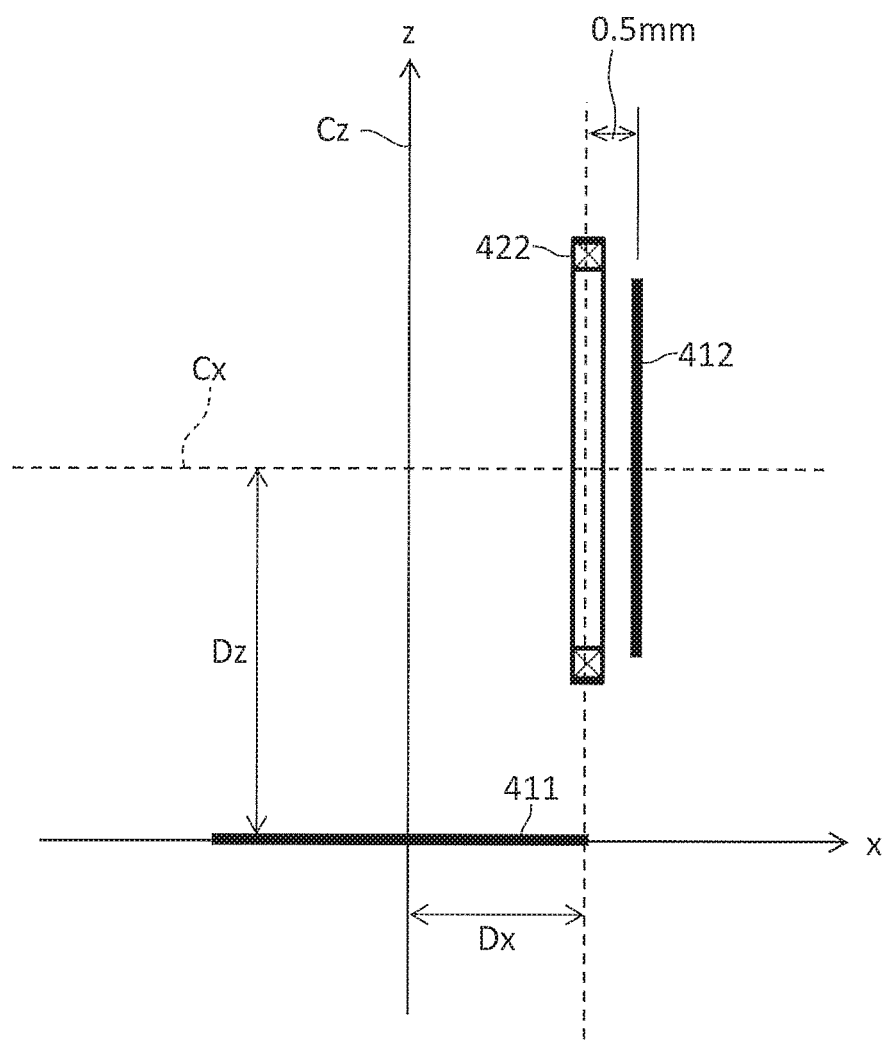
FIG. 27 is a diagram illustrating a model for SQUID magnetic sensors 1 used in a numerical simulation of symmetric relation.

FIG. 27 is a diagram illustrating a model for SQUID magnetic sensors 1 used in the numerical simulation of symmetric relation.

As illustrated in FIG. 27, a square coil having a side with an outer diameter of 14 mm is set to a feedback coil model 422 representing the feedback coil 6 of the SQUID magnetic sensor 1x. The thickness of this feedback coil model 422 is set to 0.2 mm and the inner diameter of a side is set to 13 mm. The computer calculated the distribution of the magnetic flux induced when a DC current was made to flow through this feedback coil model 422. The square detection plane model 412 having a side of 13 mm is set beside this feedback coil model 422 and is apart by 0.5 mm in the x direction. This detection plane model 412 corresponds to a plane of the detection coil 3 of the SQUID magnetic sensor 1x.

Then, the computer calculated the strength Bx of the magnetic field in the x-direction from the magnetic flux interlinked with the detection plane model 412 when a current was made to flow through the feedback coil model 422.

In addition, the square z-direction detection plane model 411 with a side of 13 mm is set at a position apart by the distance Dz in the z direction from the central axis Cx of the feedback coil model 422. The detection plane model 411 represents a plane of the detection coil 3 of the SQUID magnetic sensor 1z.

Subsequently, the computer performed 3 simulations while the Dz value was either 9 mm, 22 mm, or 35 mm. Further, Dx was set to the distance between the central axis Cz of the detection plane model 411 and feedback coil model 422, and the computer horizontally moved the detection plane model 412 while the Dx was changed from 0 to 40 mm. Then, the computer calculated the magnetic flux interlinked with the detection plane model 411 at each Dx while Dz was changed. After that, the computer calculated, based on this magnetic flux, the strength Bz of the magnetic field interlinked with the detection plane model 411. This strength Bz of the magnetic field represents the interference with the detection coil 3 of the SQUID magnetic sensor 1z as caused by the feedback coil 6 of the SQUID magnetic sensor 1x. Finally, the normalized Bz/Bx described in FIGS. 18 and 19 is used to calculate Dz dependency of the interference.

Figure 28:
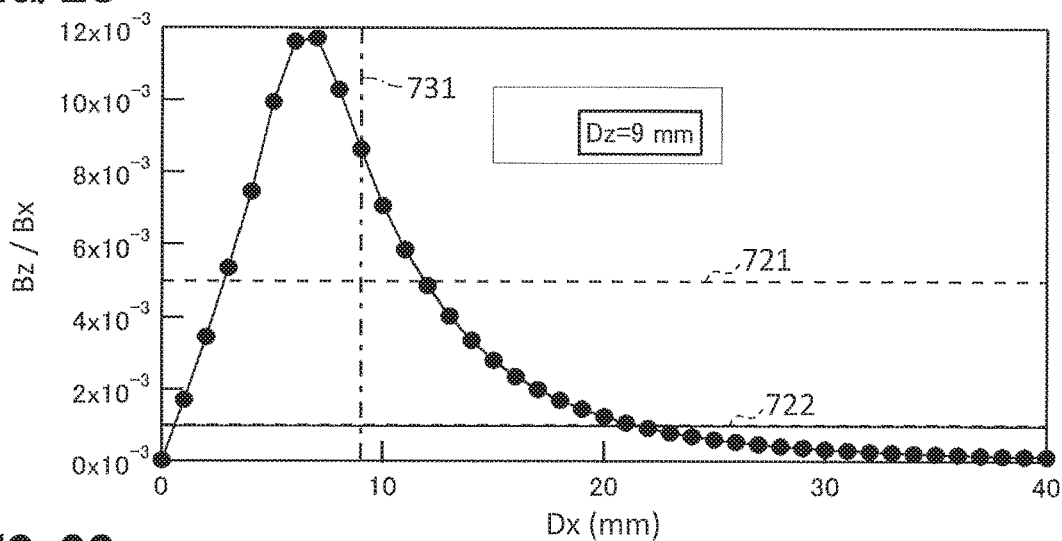
FIG. 28 is a graph (Dz=9 mm) showing Dx dependency with respect to the Bz/Bx as simulated under conditions illustrated in FIG. 27.
Figure 29:
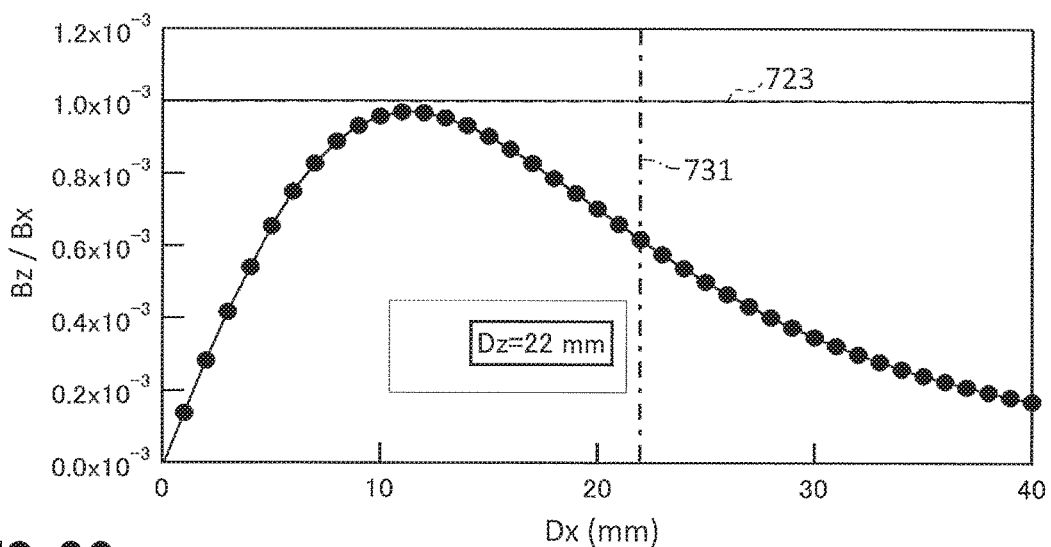
FIG. 29 is a graph (Dz=22 mm) showing Dx dependency with respect to the Bz/Bx simulated under conditions illustrated in FIG. 27.
Figure 30:
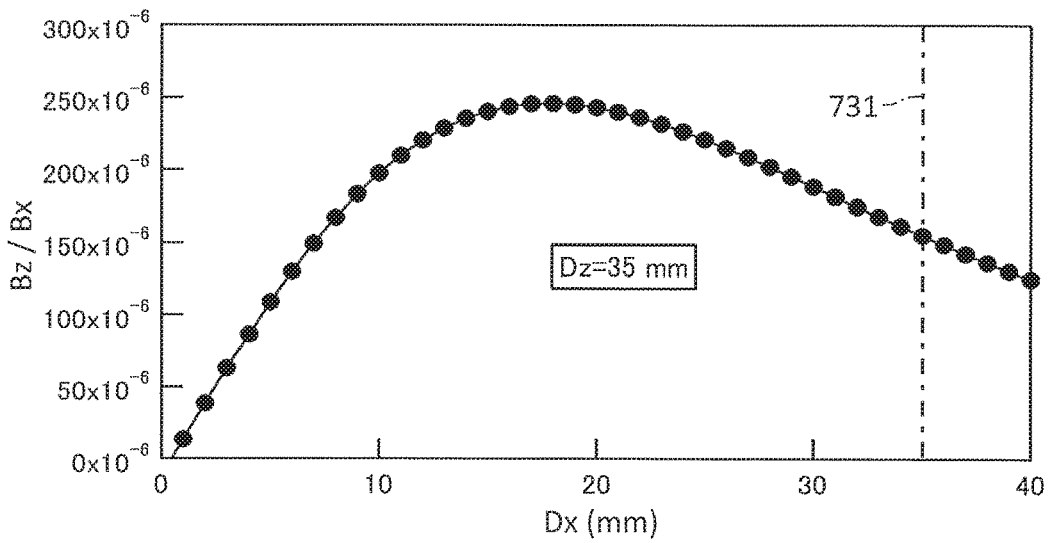
FIG. 30 is a graph (Dz=35 mm) showing Dx dependency with respect to the Bz/Bx simulated under conditions illustrated in FIG. 27.

FIGS. 28 to 30 are graphs showing Dx dependency with respect to the Bz/Bx as simulated under conditions illustrated in FIG. 27.

The vertical dashed-dotted lines 731 shown in the graphs of FIGS. 28 to 30 indicate Dx that is equal to Dz. That is, the point of intersection between the dashed-dotted line 731 and the graph corresponds to the interference between the SQUID magnetic sensors 1 under cubic arrangement.

FIG. 28 shows the case of Dz=9 mm, FIG. 29 shows the case of Dz=22 mm, and FIG. 30 shows the case of Dz=35 mm.

Further, the dashed line 721 in FIG. 28 indicates that Bz/Bx=1/200. Then, the solid line 722 in FIG. 28 and the solid line 723 in FIG. 29 indicate that Bx/Bz=1/1000.

In any of FIGS. 28 to 30, the Bz/Bx value is 0 in the case of Dx=0 where the feedback coil model 422 is positioned on the central axis Cz of the detection plane model 411. Meanwhile, there was a tendency that as Dx was deviated from 0, the Bz/Bx once increased rapidly, reached the maximum at a given Dx, and then decreased gradually. This is similar to the case of parallel relation shown in FIGS. 24 to 26, but the Bz/Bx value is a value about one order generally smaller than the Bx/Bz, value in FIGS. 24 to 26. Due to this, even in the case of Dz=22 mm, the Bz/Bx is 1/1000 or smaller over the entire region calculated.

Here, as described above, the vertical dashed-dotted lines 731 shown in the graphs of FIGS. 28 to 30 indicate Dx that is equal to Dz. That is, as described above, the point of intersection between the dashed-dotted line 731 and the graph corresponds to the interference between the SQUID magnetic sensors 1 under cubic arrangement. As such, FIGS. 28 to 30 demonstrate that the interference between the SQUID magnetic sensors 1 in symmetric relation is smaller than the interference between the SQUID magnetic sensors 1 under cubic arrangement with the same distance as of the former.

Hereinabove, the invention has been described using the embodiments. However, the technical scope of the invention is not limited to the extent described in the above embodiments. It is obvious to those skilled in the art that the above embodiments may be given various modifications or improvements. It is clear from the description of the CLAIMS that such modifications or improvements-given embodiments can be included in the technical scope of the invention.

Note that the center of the SQUID magnetic sensor 1y shown in FIG. 1 may be disposed between the central axis Cx and the plane that is the coil surface of the SQUID magnetic sensor 1z (see FIG. 4). While a dc-SQUID having two Josephson junction portions 2 is used as the SQUID inductor 8 in the embodiments, substantially the same feedback control may be carried out using an rf-SQUID having one Josephson junction portion as the SQUID inductor 8. Thus, even use of the rf-SQUID allows for the effects of the present embodiments. Further, the three-component magnetometer using three magnetic sensors, what is called a vector magnetometer, is described in the above embodiments. However, it is needless to say that the three-component magnetometer-based configuration, for instance, a tensor gradiometer having, as components, two sets of a vector magnetometer or a vector magnetometer including, as a component, a magnetometer for correction is also effective.

REFERENCE SIGNS LIST

1 SQUID magnetic sensor
1x SQUID magnetic sensor (Second SQUID magnetic sensor)
1y SQUID magnetic sensor (Third SQUID magnetic sensor)
1z SQUID magnetic sensor (First SQUID magnetic sensor)
2 Josephson junction portion
3 Detection coil
4, 5, 7 Terminal
6 Feedback coil
8 SQUID inductor
10 Magnetic field measuring unit (Magnetic field measuring device)
11 Probe head
12 Flow section
13 Liquid refrigerant
15a Container (Refrigerant retaining member)
15b Lid (Refrigerant retaining member)
17 Magnetic field measuring element
20 Control circuit unit
21 FLL circuit (FLL processing part)
22 FLL control circuit
30 Data processing unit (Information processing device)
31 A/D converter
32 PC (Information processing device)
Cx to Cz Central axis (Straight line)
E, Ea Magnetic field measuring element
Z Magnetic field measuring system

The invention claimed is:

1. A magnetic field measuring element comprising at least three SQUID magnetic sensors, each comprising a detection coil made of a superconductive material, a SQUID inductor that is connected to the detection coil and is made of the superconductive material having a Josephson junction portion, and a feedback coil generating a feedback magnetic field in the detection coil, the sensors comprising:
   a first SQUID magnetic sensor;
   a second SQUID magnetic sensor disposed either on a second plane which is perpendicular to a first plane including a coil surface of a detection coil of the first SQUID magnetic sensor and which includes a center of the first SQUID magnetic sensor, or in vicinity of the second plane; and
   a third SQUID magnetic sensor having a detection coil disposed either on a third plane which is perpendicular to the first plane and the second plane and which includes the center of the detection coil of the first SQUID magnetic sensor, or in vicinity of the third plane,
   wherein a center of a detection coil of the second SQUID magnetic sensor is present on a straight line which passes through the center of the detection coil of the first SQUID magnetic sensor and is perpendicular to the first plane, or in vicinity of the straight line, and
   a center of the detection coil of the third SQUID magnetic sensor is present in a position displaced from a line joining the center of the detection coil of the first SQUID magnetic sensor and the center of the detection coil of the second SQUID magnetic sensor.

2. The magnetic field measuring element according to claim 1, wherein the center of the detection coil of the third SQUID magnetic sensor is present between the first plane and a straight line which passes through the center of the detection coil of the second SQUID magnetic sensor and is perpendicular to the second plane.

3. The magnetic field measuring element according to claim 2, wherein a distance between the center of the detection coil of the first SQUID magnetic sensor and the center of the detection coil of the first SQUID magnetic sensor, a distance between the center of the detection coil of the second SQUID magnetic sensor and the center of the detection coil of the third SQUID magnetic sensor, and a distance between the center of the detection coil of the third SQUID magnetic sensor and the center of the detection coil of the second SQUID magnetic sensor are substantially the same distance.

4. A magnetic field measuring device comprising: a refrigerant retaining member for retaining a liquid refrigerant; and the inserted magnetic field measuring element according to claim 1.

5. A magnetic field measuring system comprising: the magnetic field measuring element according to claim 1; and an information processing device configured to process information output from the magnetic field measuring element.

* * * * *